US010163764B2

(12) United States Patent
Liu et al.

(10) Patent No.: US 10,163,764 B2
(45) Date of Patent: Dec. 25, 2018

(54) SEMICONDUCTOR COMPONENT AND METHOD OF MANUFACTURE

(71) Applicant: Semiconductor Components Industries, LLC, Phoenix, AZ (US)

(72) Inventors: Chun-Li Liu, Scottsdale, AZ (US); Ali Salih, Mesa, AZ (US); Balaji Padmanabhan, Tempe, AZ (US); Mingjiao Liu, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/690,773

(22) Filed: Aug. 30, 2017

(65) Prior Publication Data

US 2018/0005927 A1 Jan. 4, 2018

Related U.S. Application Data

(62) Division of application No. 15/207,626, filed on Jul. 12, 2016, now Pat. No. 9,780,019.

(Continued)

(51) Int. Cl.
*H01L 23/495* (2006.01)
*H01L 25/18* (2006.01)
(Continued)

(52) U.S. Cl.
CPC .... *H01L 23/49575* (2013.01); *H01L 23/4952* (2013.01); *H01L 23/49524* (2013.01); *H01L 23/49562* (2013.01); *H01L 23/49861* (2013.01); *H01L 24/48* (2013.01); *H01L 24/49* (2013.01); *H01L 24/73* (2013.01); *H01L 25/18* (2013.01); *H01L 23/3735* (2013.01); *H01L 29/16* (2013.01); *H01L 29/2003* (2013.01); *H01L 2224/37099* (2013.01); *H01L 2224/40105* (2013.01); *H01L 2224/40245* (2013.01); *H01L 2224/48091* (2013.01); *H01L 2224/48105* (2013.01); *H01L 2224/48145* (2013.01); *H01L 2224/48245* (2013.01); *H01L 2224/49112* (2013.01); *H01L 2224/49176* (2013.01);

(Continued)

(58) Field of Classification Search
CPC ......... H01L 23/49575; H01L 23/49861; H01L 23/4952; H01L 23/49524
See application file for complete search history.

(56) References Cited

U.S. PATENT DOCUMENTS 7,745,913 B2 6/2010 Hosseini et al.
8,455,987 B1 6/2013 Spann et al.
(Continued)

*Primary Examiner* — Anthony Ho
(74) *Attorney, Agent, or Firm* — Rennie William Dover

(57) ABSTRACT

A semiconductor component includes a support having a lead integrally formed thereto. An insulated metal substrate is mounted to a surface of the support and a semiconductor chip is mounted to the insulated metal substrate. A III-N based semiconductor chip is mounted to the insulated metal substrate, where the III-N based semiconductor chip has a gate bond pad, a drain bond pad, and a source bond pad. A silicon based semiconductor chip is mounted to the III-N based semiconductor chip. In accordance with an embodiment the silicon based semiconductor chip includes a device having a gate bond pad, a drain bond pad, and a source bond pad. The drain bond pad of the III-N based semiconductor chip may be bonded to the substrate or to a lead. In accordance with another embodiment, the silicon based semiconductor chip is a diode.

20 Claims, 17 Drawing Sheets

Related U.S. Application Data

(60) Provisional application No. 62/196,631, filed on Jul. 24, 2015.

(51) Int. Cl.
  *H01L 23/00* (2006.01)
  *H01L 23/498* (2006.01)
  *H01L 29/20* (2006.01)
  *H01L 29/16* (2006.01)
  *H01L 23/373* (2006.01)

(52) U.S. Cl.
  CPC ............... *H01L 2224/49177* (2013.01); *H01L 2224/73221* (2013.01); *H01L 2924/00014* (2013.01); *H01L 2924/1203* (2013.01); *H01L 2924/1306* (2013.01)

(56) References Cited

U.S. PATENT DOCUMENTS

| | | |
|---|---|---|
| 2007/0249092 A1 | 10/2007 | Joshi et al. |
| 2008/0164590 A1 | 7/2008 | Xiaochun et al. |
| 2010/0232131 A1 | 9/2010 | Qian et al. |
| 2011/0133251 A1 | 6/2011 | He |
| 2012/0223321 A1 | 9/2012 | Lin et al. |
| 2012/0223322 A1 | 9/2012 | Lin et al. |
| 2013/0069208 A1 | 3/2013 | Briere |
| 2013/0088280 A1 | 3/2013 | Lal et al. |
| 2013/0175704 A1 | 7/2013 | Jeun |
| 2013/0256856 A1 | 10/2013 | Mahler et al. |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0361419 A1 | 12/2014 | Xue et al. |
| 2015/0145112 A1 | 5/2015 | Otremba |
| 2016/0211246 A1 | 7/2016 | Akiyama et al. |
| 2016/0247792 A1 | 8/2016 | Chang |

US 10,163,764 B2

SEMICONDUCTOR COMPONENT AND METHOD OF MANUFACTURE

The present application is a divisional application of Nonprovisional patent application Ser. No. 15/207,626 filed on Jul. 12, 2016, by Chun-Li Liu et al., titled "SEMICONDUCTOR COMPONENT AND METHOD OF MANUFACTURE", which is a Nonprovisional application of Provisional Patent Application No. 62/196,631 filed on Jul. 24, 2015, by Chun-Li Liu et al., titled "SEMICONDUCTOR COMPONENT AND METHOD OF MANUFACTURE", which are hereby incorporated by reference in their entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs) High Electron Mobility Transistors (HEMTs), etc. Devices such as diodes, Schottky diodes, and FETs were typically manufactured from a silicon substrate. Drawbacks with semiconductor devices manufactured from a silicon substrate include low breakdown voltages, excessive reverse leakage current, large forward voltage drops, unsuitably low switching characteristics, high power densities, and high costs of manufacture. To overcome these drawbacks, semiconductor device manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs. Thus, the semiconductor industry has begun using compound semiconductor substrates that are a combination of silicon and III-N materials to address the issues of cost, manufacturability, and fragility. A III-N compound semiconductor material formed on a silicon or other semiconductor substrate has been described in U.S. Patent Application Publication Number 2011/0133251 A1 by Zhi He and published on Jun. 9, 2011 and in U.S. Patent Application Publication Number 2013/0069208 A1 by Michael A. Briere and published on Mar. 21, 2013.

Semiconductor device manufacturers have used a combination of silicon semiconductor materials and III-N semiconductor materials to manufacture cascoded devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the avalanche operating mode, the gate of the III-N device is under a large stress in which the absolute gate to source voltage exceeds the devices pinch-off voltage. Hard stress conditions such as operating the silicon device in the avalanche mode degrades device reliability, lowers the breakdown voltage, and increases leakage currents. Cascoded semiconductor devices have been described in U.S. Patent Application Publication Number 2013/0088280 A1 by Rakesh K. Lal et al. and published on Apr. 11, 2013.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
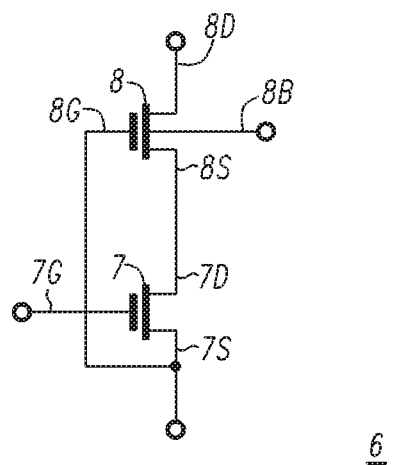
FIG. 1 is a circuit schematic of a semiconductor component in a cascode configuration, wherein a substrate of a III-N device is floating.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, the present invention provides a semiconductor component that includes a support having first and second opposing sides and a first lead integrally formed with the support. An insulated metal substrate is bonded to the support, wherein the insulated metal substrate has a first surface and a second surface. The second surface of the insulated metal substrate is coupled to the support. A portion of the first surface serves as a die receiving area. A semiconductor chip configured from a III-N semiconductor material is mounted to the die receiving area. The III-N based semiconductor chip has a gate bond pad, a drain bond pad, and a source bond pad. The III-N based semiconductor chip further includes a surface coupled to the die receiving area. A silicon based semiconductor chip is mounted to the III-N semiconductor chip. The silicon based semiconductor chip has a gate bond pad, a drain bond pad, a source bond pad, and a surface that is coupled to the source bond pad of the III-N semiconductor chip.

In accordance with another embodiment, the chip mounted to the III-N based semiconductor chip is a diode.

In accordance with another embodiment, the support comprises a mold compound.

FIG. 1 is a circuit schematic 6 of a semiconductor component in a cascode configuration. The semiconductor component includes transistors 7 and 8, where transistor 7 has a gate electrode 7G, a source electrode 7S, and a drain electrode 7D, and transistor 8 has a gate electrode 8G, a source electrode 8S, a drain electrode 8D, and a body terminal 8B. Drain electrode 7D is electrically connected to source electrode 8S and source electrode 7S is electrically connected to gate electrode 8G. Drain electrode 8D may be coupled for receiving a first source of operating potential for the cascode semiconductor component such as, for example, an operating potential $V_{DD}$, gate electrode 7G serves as an input terminal for cascoded semiconductor component, and source electrode 7S is coupled for the receiving a second source of operating potential such as, for example operating potential $V_{SS}$. By way of example, operating potential $V_{SS}$ is ground. It should be noted that the substrate or body 8B of GaN transistor 8 is floating, thus the semiconductor component may be referred to as being in a floating configuration or substrate floating configuration.

Figure 2:
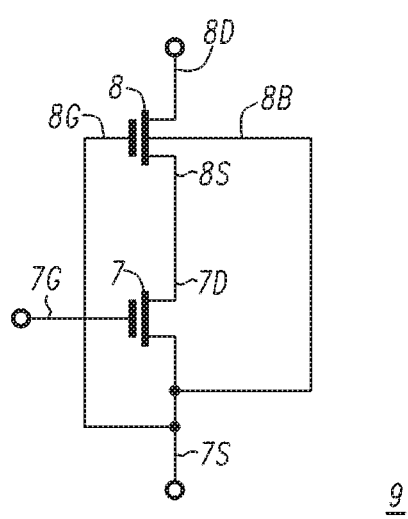
FIG. 2 is a circuit schematic of a semiconductor component in a cascode configuration, wherein a substrate of a III-N device is coupled to a source electrode of a silicon semiconductor device.

FIG. 2 is a circuit schematic 9 of a semiconductor component in a cascode configuration. The semiconductor component includes transistors 7 and 8, where transistor 7 has a gate electrode 7G, a source electrode 7S, and a drain electrode 7D, and transistor 8 has a gate electrode 8G, a source electrode 8S, a drain electrode 8D, and a body terminal 8B. Drain electrode 7D is electrically connected to source electrode 8S and source electrode 7S is electrically connected to gate electrode 8G. Drain electrode 8D may be coupled for receiving a first source of operating potential for the cascode semiconductor component such as, for example, operating potential $V_{DD}$, gate electrode 7G serves as an input terminal for the cascoded semiconductor component, and source electrode 7S is coupled for receiving a second source of operating potential such as, for example, operating potential $V_{SS}$. Substrate terminal 8B of transistor 8 is electrically connected to source electrode 7S. Thus, the substrate of transistor 8 is coupled to the same potential as source electrode 7. Source electrode 7 may be coupled for receiving a ground potential or a potential that is different from ground.

Figure 3:
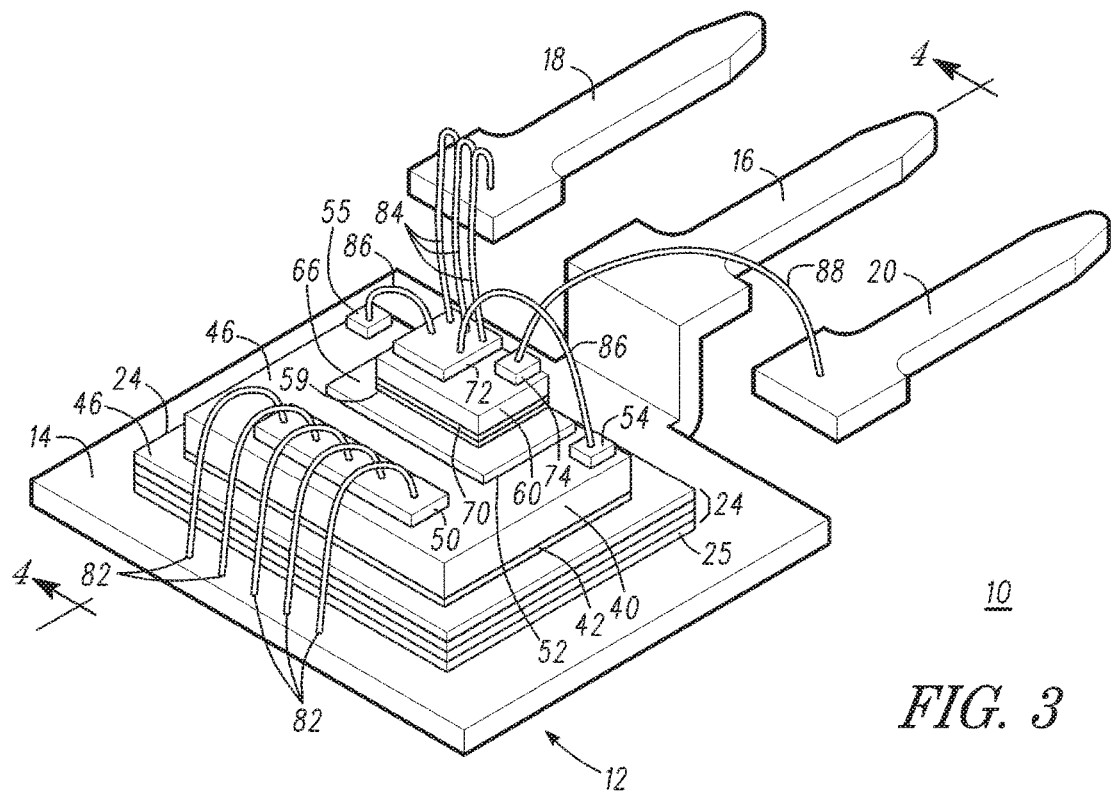
FIG. 3 is a perspective view of a semiconductor component in a cascode configuration in accordance with an embodiment of the present invention.
Figure 4:
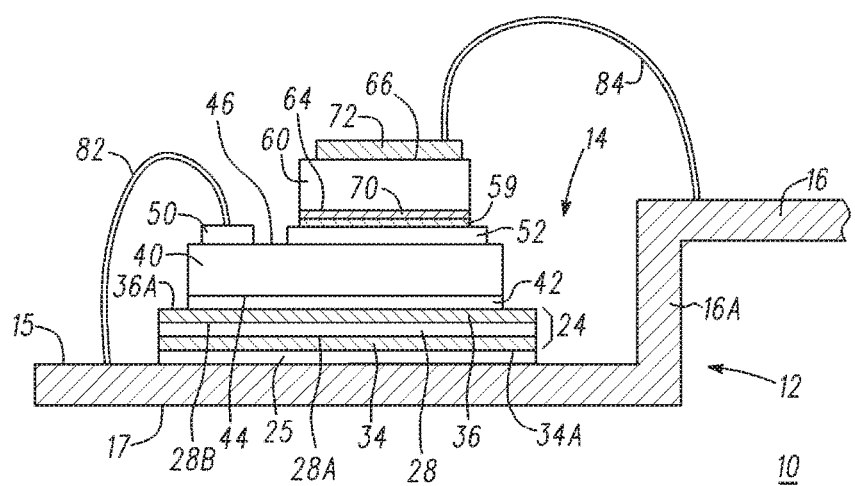
FIG. 4 is a cross-sectional view of the semiconductor component of FIG. 3 taken along section line 4-4 of FIG. 3.

FIG. 3 is a perspective view of a semiconductor component 10 in accordance with an embodiment of the present invention and FIG. 4 is a cross-sectional view of semiconductor component 10 taken along section line 4-4 of FIG. 3. FIGS. 3 and 4 are described together. What is shown in FIGS. 3 and 4 are a leadframe 12 comprising a device receiving area 14 and leadframe leads 16, 18, and 20, wherein device receiving area 14 and leadframe lead 16 are integrally formed with each other, i.e., device receiving area 14 and leadframe lead 16 are derived from an electrically conductive material wherein a portion of the electrically conductive material serves as device receiving area 14 and another portion of the electrically conductive material serves as leadframe lead 16. Device receiving area 14 has opposing surfaces 15 and 17. In accordance with an embodiment, the electrically conductive material is copper and the portion of the electrically conductive material that includes device receiving area 14 is formed in a plane and the portion of the electrically conductive material that includes leadframe lead 16 is formed in another plane that is different from the plane that includes device receiving area 14. Thus, device receiving area 14 and leadframe lead 16 are not co-planar. Leadframe lead 16 includes a connector portion 16A that connects leadframe lead 16 to device receiving area 14. Leadframe leads 18 and 20 are coplanar with leadframe lead 16. It should be noted that leadframe 12 is illustrated and described as a single element; however, it may be a portion singulated from a leadframe strip and that leadframe 12 conforms with through hole package outlines such as a TO-220 outline, a TO-247 outline, a TO-264 outline, a TO-257 outline, or the like.

An insulated metal substrate 24 is bonded to a portion of device receiving area 14 using an electrically conductive material 25. Electrically conductive material 25 may be solder, an electrically conductive epoxy, or the like. Although material 25 has been described as an electrically conductive material, this is not a limitation of the present invention. For example, material 25 can be an electrically insulating material or a thermally conductive material. By way of example, insulated metal substrate 24 is a direct bonded copper substrate comprising an insulating material 28 having major surfaces 28A and 28B, wherein an electrically conductive layer 34 is formed on major surface 28A and an electrically conductive layer 36 is formed on major surface 28B. Electrically conductive layer 34 has a surface 34A that serves as a surface of insulated metal substrate 24 and electrically conductive layer 36 has a surface 36A that serves as an opposing surface of insulated metal substrate 24. In accordance with an embodiment, insulated metal substrate 24 is a direct bonded copper substrate wherein insulating material 28 is aluminum nitride and electrically conductive layers 34 and 36 are copper. Other suitable materials for insulating material 28 include alumina, beryllium oxide, ceramic, or the like and other suitable materials for electrically conductive layers 34 and 36 include aluminum, other metals, or the like. It should be noted that the material through which insulated metal substrate 24 is bonded to die receiving area 14 is not limited to being solder.

Although an insulated metal substrate is described as being bonded to device receiving area 14 by electrically conductive material 25, this is not a limitation of the present invention. Alternatively, a layer of electrically insulating material may be formed on device receiving area 14 of leadframe 12. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

A semiconductor chip 40 is bonded to surface 36A of insulated metal substrate 24 using a die attach material 42. In accordance with an embodiment, semiconductor chip 40 is a compound semiconductor chip having opposing major surfaces 44 and 46, wherein semiconductor chip 40 includes a field effect semiconductor device having a drain contact 50 formed on surface 46, a source contact 52 formed on a portion of surface 46, and gate contacts 54 and 55 formed on other portions of surface 46. In accordance with embodiments in which a discrete semiconductor device such as for example, a field effect transistor, is formed from semiconductor chip 40, semiconductor chip 40 may be referred to as a semiconductor device. It should be noted that semiconductor device 40 is not limited to being a vertical field effect transistor or a field effect transistor. For example, semiconductor device 40 may be an insulated gate bipolar transistor, a bipolar transistor, a junction field effect transistor, a diode, or the like. It should be further noted that the semiconductor material of semiconductor chip 40 may include III-N semiconductor materials such as, for example, gallium nitride, or it may include a III-V semiconductor material, a II-VI semiconductor material, or the like.

A semiconductor chip 60 is bonded to or mounted on semiconductor chip 40 using a bonding agent 59, which bonding agent may be a thermally and electrically conductive material. More particularly, semiconductor chip 60 is bonded to source contact 52 using bonding agent 59. In accordance with an embodiment, semiconductor chip 60 is a silicon chip having opposing major surfaces 64 and 66, wherein semiconductor chip 60 includes a vertical field effect semiconductor device having a drain contact 70 formed on surface 64, a source contact 72 formed on a portion of surface 66, and a gate contact 74 formed on another portion of surface 66. In accordance with embodiments in which a discrete semiconductor device such as for example, a field effect transistor, is formed from semiconductor chip 60, semiconductor chip 60 may be referred to as a semiconductor device. Drain contact 70 is bonded to source contact 52 of semiconductor device 40 through bonding agent 59. It should be noted that semiconductor device 60 is not limited to being a vertical field effect transistor or a field effect transistor. For example, semiconductor device 60 may be an insulated gate bipolar transistor, a bipolar transistor, a junction field effect transistor, a diode, or the like.

Drain contact 50 of semiconductor device 40 is electrically connected to die receiving area 14 through bond wires 82. Source contact 72 of semiconductor device 60 is electrically connected to leadframe lead 18 through bond wires 84 and to gate contacts 54 and 55 of semiconductor device 40 through bond wires 86. Gate contact 74 of semiconductor device 60 is electrically connected to leadframe lead 20 through a bond wire 88. Gate contact 54 is electrically connected to gate contact 55 through a metallization system, not shown. Bond wires may be referred to as wirebonds.

As those skilled in the art are aware, insulated metal substrate 24, semiconductor chips 40 and 60, and bond wires 82, 84, 86, and 88, and portions of leadframe 12 are typically encapsulated in a protection material (not shown) such as, for example a mold compound. It should be noted that surface 17 of device receiving area 14 may not be covered or protected by a mold compound.

Semiconductor component 10 includes a III-N cascode switch in which the substrate of the III-N semiconductor material is electrically floating and bond pads are not formed over active regions or active areas of semiconductor device 40. Semiconductor component 10 may be represented schematically by circuit schematic 6 of FIG. 1. Thus, the substrate material of III-N semiconductor device 40 of semiconductor component 10 is floating, e.g., terminal 8B of III-N transistor 8 is open or floating. It should be appreciated that semiconductor component 10 may be configured for packaging in a package that conforms with through hole package outlines such as, for example, a TO-220 package, a TO-247 package, a TO-264 package, a TO-257 package, or the like.

Figure 5:
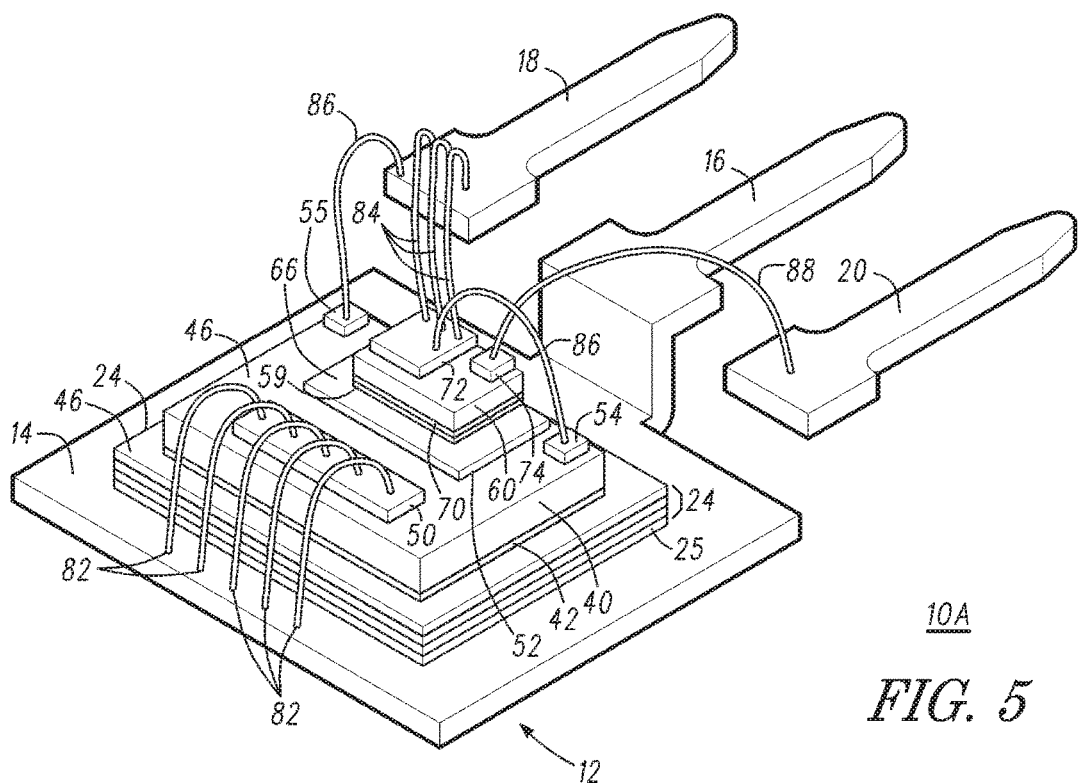
FIG. 5 is a perspective view of a semiconductor component in a cascode configuration in accordance with another embodiment of the present invention.

FIG. 5 is a perspective view of a semiconductor component 10A in accordance with another embodiment of the present invention. What is shown in FIG. 5 is a leadframe 12 having semiconductor chips 40 and 60 mounted thereon as described with reference to FIGS. 3 and 4. Semiconductor component 10A of FIG. 5 differs from semiconductor component 10 of FIGS. 3 and 4 in that bond wire 86 is electrically coupled directly to leadframe lead 18 rather than to source contact 72 of semiconductor chip 60. Thus, gate contact 55 is directly connected to source lead 18 by bond wire 86, rather than being connected to source lead 18 through source contact 72. It should be noted that one or both of gate contacts 54 and 55 may be directly connected to source lead 18 through a bond wire rather than through source contact 72.

As those skilled in the art are aware, insulated metal substrate 24, semiconductor chips 40 and 60, and bond wires 82, 84, 86, and 88, and portions of leadframe 12 are typically encapsulated in a protection material (not shown) such as, for example a mold compound. It should be noted that surface 17 of device receiving area 14 may not be covered or protected by a mold compound.

Like semiconductor component 10, semiconductor component 10A includes a III-N cascode switch in which the substrate of the III-N semiconductor material is electrically floating and bond pads are not formed over active regions or active areas of semiconductor device 40. Semiconductor component 10A may be represented schematically by circuit schematic 7 of FIG. 1. Thus, the substrate material of III-N semiconductor device 40 of semiconductor component 10 is floating, e.g., terminal 8B of III-N transistor 8 is open or floating. It should be appreciated that semiconductor component 10 may be configured for packaging in a package that conforms with through hole package outlines such as, for example, a TO-220 package, a TO-247 package, a TO-264 package, a TO-257 package, or the like.

Figure 6:
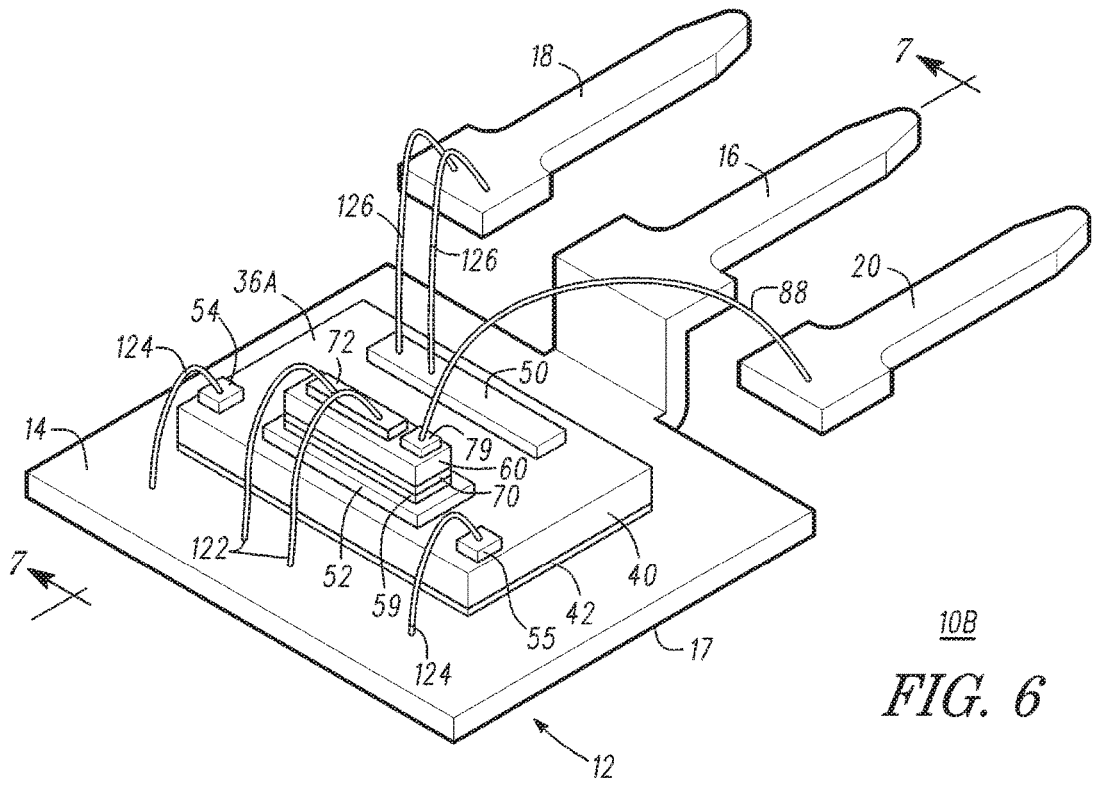
FIG. 6 is a perspective view of a semiconductor component in a cascode configuration in accordance with another embodiment of the present invention.
Figure 7:
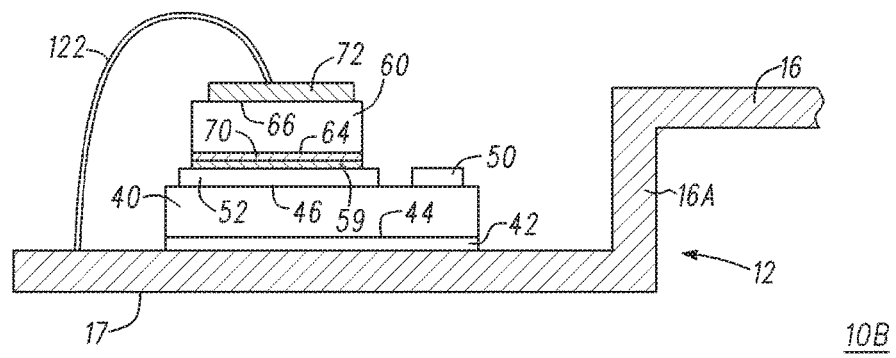
FIG. 7 is a cross-sectional view of the semiconductor component of FIG. 7 taken along section line 7-7 of FIG. 6.

FIG. 6 is a perspective view of a semiconductor component 10B in accordance with an embodiment of the present invention and FIG. 7 is a cross-sectional view of semiconductor component 10B taken along section line 7-7 of FIG. 6. It should be noted that FIGS. 6 and 7 are described together. What is shown in FIGS. 6 and 7 is a leadframe 12 comprising a device receiving area 14 and leadframe leads 16, 18, and 20, wherein device receiving area 14 and leadframe lead 16 are integrally formed with each other, i.e., device receiving area 14 and leadframe lead 16 are derived from an electrically conductive material wherein a portion of the electrically conductive material serves as device receiving area 14 and another portion of the electrically conductive material serves as leadframe lead 16. Device receiving area 14 has opposing surfaces 15 and 17. In accordance with an embodiment, the electrically conductive material is copper and the portion of the electrically conductive material that includes device receiving area 14 is formed in a plane and the portion of the electrically conductive material that includes leadframe lead 16 is formed in another plane that is different from the plane that includes device receiving area 14. Thus, device receiving area 14 and leadframe lead 16 are not co-planar. Leadframe lead 16 includes a connector portion 16A that connects leadframe lead 16 to device receiving area 14. Leadframe leads 18 and 20 are coplanar with leadframe lead 16. It should be noted that leadframe 12 is illustrated and described as a single element; however, it may be a portion singulated from a leadframe strip and that leadframe 12 conforms with through hole package outlines such as a TO-220 outline, a TO-247 outline, a TO-264 outline, a TO-257 outline, or the like.

A semiconductor chip 40 is bonded to a portion of the die receiving area 14 using an electrically conductive die attach material 42. In accordance with an embodiment, semiconductor chip 40 is a compound semiconductor chip having opposing major surfaces 44 and 46, wherein semiconductor chip 40 includes a field effect semiconductor device having a drain contact 50 formed on surface 46, a source contact 52 formed on a portion of surface 46, and gate contacts 54 and 55 formed on other portions of surface 46. In accordance with embodiments in which a discrete semiconductor device such as for example, a field effect transistor, is formed from semiconductor chip 40, semiconductor chip 40 may be referred to as a semiconductor device. It should be noted that semiconductor device 40 is not limited to being a vertical field effect transistor or a field effect transistor. For example, semiconductor device 40 may be an insulated gate bipolar transistor, a bipolar transistor, a junction field effect transistor, a diode, or the like. It should be further noted that the semiconductor material of semiconductor chip 40 may include III-N semiconductor materials such as, for example, gallium nitride, or it may include a III-V semiconductor material, a II-VI semiconductor material, or the like.

A semiconductor chip 60 is bonded to or mounted on semiconductor chip 40 using a bonding agent 59, which bonding agent may be a thermally and electrically conductive material. More particularly, semiconductor chip 60 is bonded to source contact 52 using bonding agent 59. In accordance with an embodiment, semiconductor chip 60 is a silicon chip having opposing major surfaces 64 and 66, wherein semiconductor chip 60 includes a vertical field effect semiconductor device having a drain contact 70 formed on surface 64, a source contact 72 formed on a portion of surface 66, and a gate contact 74 formed on another portion of surface 66. In accordance with embodiments in which a discrete semiconductor device such as for example, a field effect transistor, is formed from semiconductor chip 60, semiconductor chip 60 may be referred to as a semiconductor device. Drain contact 70 is bonded to source contact 52 of semiconductor device 40 through bonding agent 59. It should be noted that semiconductor device 60 is not limited to being a vertical field effect transistor or a field effect transistor. For example, semiconductor device 60 may be an insulated gate bipolar transistor, a bipolar transistor, a junction field effect transistor, a diode, or the like.

Drain contact 50 of semiconductor device 40 is electrically connected to leadframe lead 18 through bond wires 126. Source contact 72 of semiconductor device 60 is electrically connected to die receiving area 14 through bond wires 122. The gate contacts 54 and 55 of semiconductor device 40 are also connected to the device receiving area 14 through bond wires 124. Gate contact 74 of semiconductor device 60 is electrically connected to leadframe lead 20 through a bond wire 88. Gate contact 54 is electrically connected to gate contact 55 through a metallization system, not shown. Bond wires may be referred to as wirebonds.

As those skilled in the art are aware, semiconductor chips 40 and 60, and bond wires 122, 124, 126, and 88, and portions of leadframe 12 are typically encapsulated in a protection material (not shown) such as, for example a mold compound. It should be noted that surface 17 of device receiving area 14 may not be covered or protected by a mold compound.

Semiconductor component 10B includes a III-N cascode switch in which the substrate of the III-N semiconductor material is electrically connected to the source contact 72, i.e., to the source, of the silicon semiconductor chip 60 and to the gate bond pads (54 and 55) of the III-N semiconductor chip 40. The bond pads of the III-N semiconductor chip 40 are not formed over active regions or active areas of semiconductor chip 40. Semiconductor component 10B may be represented schematically by circuit schematic 9 of FIG. 2. Thus, the substrate material of III-N semiconductor device 40 of semiconductor component 10B is connected to the source of the silicon transistor 60 of semiconductor component 10B. It should be noted that leadframe 12 is illustrated and described as a single element; however, it may be a portion singulated from a leadframe strip and that leadframe 12 conforms with through hole package outlines such as, for example, a TO-220 outline, a TO-247 outline, a TO-264 outline, a TO-257 outline, or the like.

Figure 8:
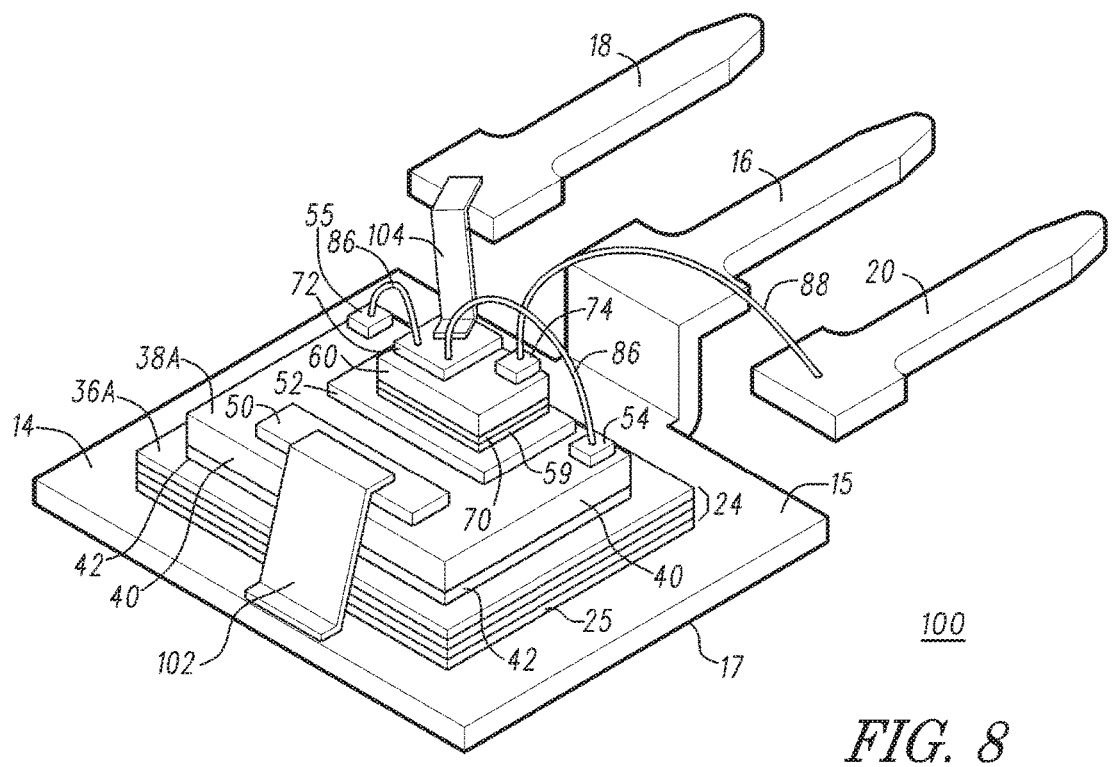
FIG. 8 is a perspective view of a semiconductor component in a cascode configuration in accordance with another embodiment of the present invention.

FIG. 8 is a perspective view of a semiconductor component 100 in accordance with another embodiment of the present invention. Semiconductor component 100 is similar to semiconductor component 10 except that bond wires 82 have been replaced by an electrically conductive clip 102 and bond wires 84 have been replaced by an electrically conductive clip 104. It should be noted that mounting semiconductor chip 40 to insulated metal substrate 24 and mounting insulated metal substrate 24 to device receiving area 14 have been described with reference to FIGS. 3 and 4. Thus, semiconductor component 100 includes a III-N cascode switch in which the substrate of the III-N semiconductor material is electrically floating and bond pads are not formed over active regions or active areas of semiconductor device 40.

Although an insulated metal substrate is described as being bonded to device receiving area 14 by electrically conductive material 25, this is not a limitation of the present invention. Alternatively, a layer of electrically insulating material may be formed on device receiving area 14 of leadframe 12. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

Semiconductor component 100 may be represented schematically by circuit schematic 6 of FIG. 1. Thus, the substrate material of III-N semiconductor device 40 of semiconductor component 100 is floating, e.g., terminal 8B of III-N transistor 8 is open or floating. It should be appreciated that semiconductor component 100 may be configured for packaging in a package that conforms with through hole package outlines such as, for example, a TO-220 package, a TO-247 package, a TO-264 package, a TO-257 package, or the like.

Figure 9:
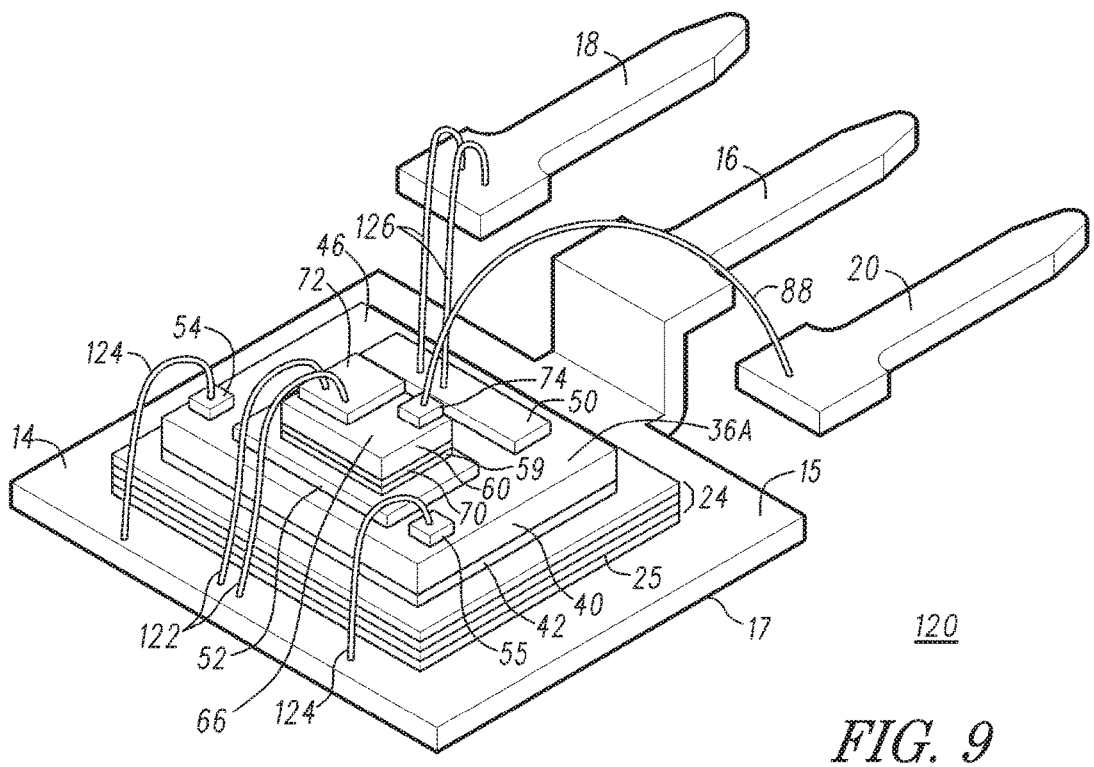
FIG. 9 is a perspective view of a semiconductor component in a cascode configuration in accordance with another embodiment of the present invention.

FIG. 9 is a perspective view of a semiconductor component 120 in accordance with another embodiment of the present invention. Semiconductor component 120 is similar to semiconductor component 10 except that semiconductor chip 40 is rotated 180 degrees and then bonded to or mounted on insulated metal substrate 24. In addition, the wirebonding configuration is different from that of semiconductor component 10. Like semiconductor component 10, gate electrode 74 of silicon semiconductor device 60 is electrically connected to leadframe lead 20 through bond wire 88; however, source electrode 72 of silicon semiconductor device 60 is electrically connected to device receiving area 14 through bond wires 122, gate electrodes 54 and 55 of silicon semiconductor device 40 are electrically connected to device receiving area 14 through bond wires 124, and drain electrode 50 is electrically connected to leadframe lead 18 through bondwires 126. Thus, semiconductor component 120 includes a III-N cascode switch in which the substrate of the III-N semiconductor material is electrically floating and bond pads are not formed over active regions or active areas of semiconductor device 40.

Although an insulated metal substrate is described as being bonded to device receiving area 14 by electrically conductive material 25, this is not a limitation of the present invention. Alternatively, a layer of electrically insulating material may be formed on device receiving area 14 of leadframe 12. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

Semiconductor component 120 may be represented schematically by circuit schematic 6 of FIG. 1. Thus, the substrate material of III-N semiconductor device 40 of semiconductor component 120 is floating, e.g., terminal 8B of III-N transistor 8 is open or floating. It should be appreciated that semiconductor component 120 may be configured for packaging in a package that conforms with through hole package outlines such as, for example, a TO-220 package, a TO-247 package, a TO-264 package, a TO-257 package, or the like.

Still referring to FIG. 9, in an alternative embodiment, insulated metal substrate 24 can be absent with semiconductor chip 40 directly bonded to device receiving area 14. The remaining circuit connections are unchanged. In this alternative embodiment, the circuit configuration is similar to circuit schematic 7 shown in FIG. 2.

Figure 10:
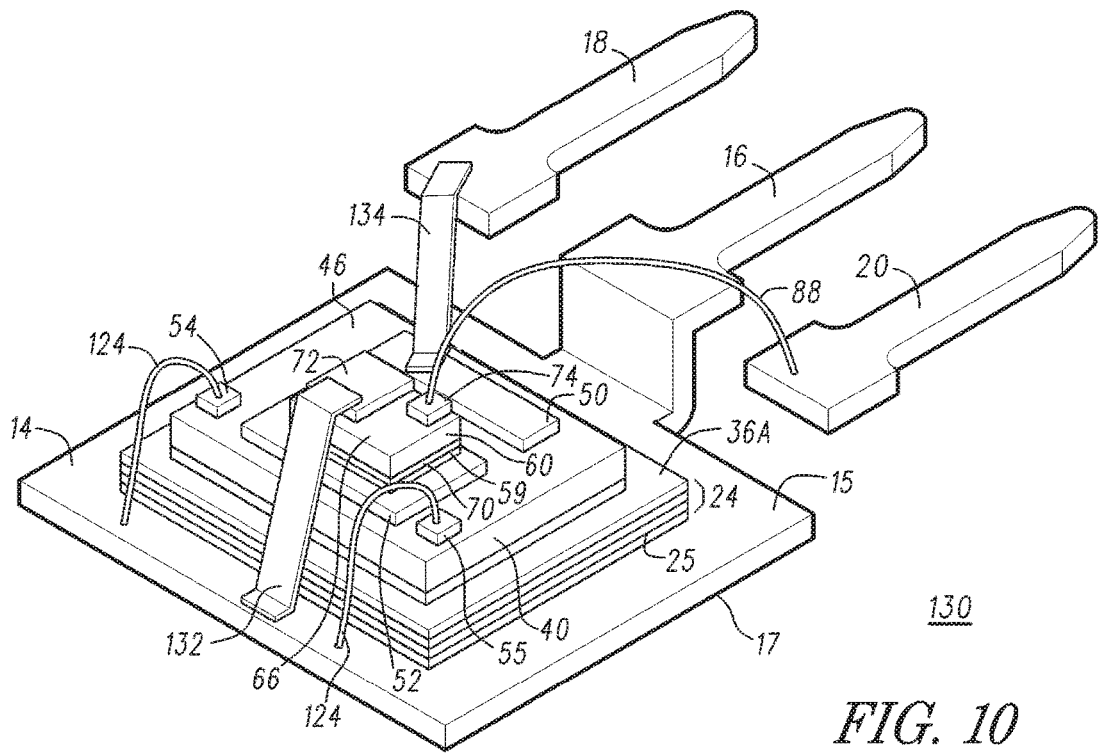
FIG. 10 is a perspective view of a semiconductor component in a cascode configuration in accordance with another embodiment of the present invention.

FIG. 10 is a perspective view of a semiconductor component 130 in accordance with another embodiment of the present invention. Semiconductor component 130 is similar to semiconductor component 120 except that bond wires 122 have been replaced by an electrically conductive clip 132 and bond wires 126 have been replaced by an electrically conductive clip 134. It should be noted that mounting semiconductor chip 40 to insulated metal substrate 24 and mounting semiconductor chip 60 to semiconductor chip 40 have been described with reference to FIGS. 3 and 4. Thus, semiconductor component 130 includes a III-N cascode switch in which the substrate of the III-N semiconductor material is electrically floating and bond pads are not formed over active regions or active areas of semiconductor device 40.

Semiconductor component 130 may be represented schematically by circuit schematic 6 of FIG. 1. Thus, the substrate material of III-N semiconductor device 40 of semiconductor component 130 is floating, e.g., terminal 8B of III-N transistor 8 is open or floating. It should be appreciated that semiconductor component 130 may be configured for packaging in a package that conforms with through hole package outlines such as, for example, a TO-220 package, a TO-247 package, a TO-264 package, a TO-257 package, or the like.

Figure 11:
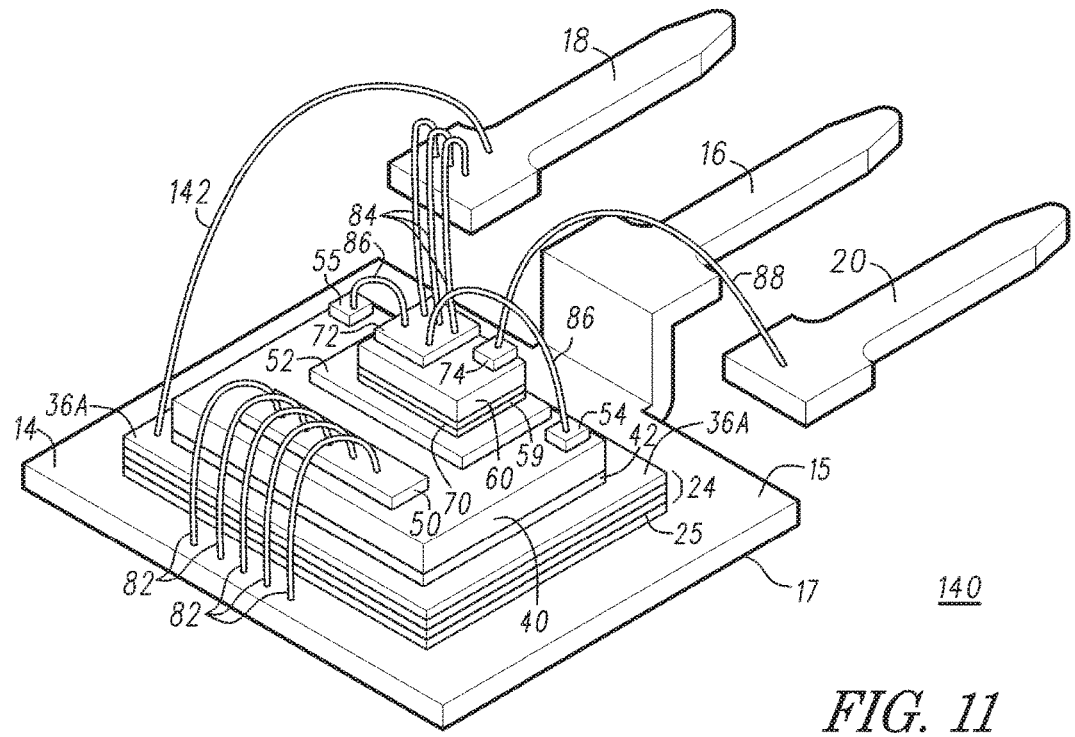
FIG. 11 is a perspective view of a semiconductor component in a cascode configuration in accordance with another embodiment of the present invention.

FIG. 11 is a perspective view of a semiconductor component 140 in accordance with another embodiment of the present invention. Semiconductor component 140 is similar to semiconductor component 10 except that semiconductor component 140 includes a bond wire 142 connecting surface 36A of insulated metal substrate 24 to leadframe lead 18. Bond wire 142 electrically connects source electrode 72, hence the source, of semiconductor device 60 to the body of semiconductor material of semiconductor device 40 through electrically conductive material 42. Thus, semiconductor component 140 includes a III-N cascode switch in which the substrate of the III-N semiconductor material is connected to source electrode 72 of semiconductor device 60 and bond pads are not formed over active regions or active areas of semiconductor device 40.

Semiconductor component 140 may be represented schematically by circuit schematic 9 of FIG. 2. Thus, the substrate material of III-N semiconductor device 40 of semiconductor component 140, e.g., terminal 8B of III-N transistor 8 is electrically connected to source bond pad 72 of semiconductor chip 60, e.g., source 7S of silicon transistor 7. In accordance with an embodiment, source 7S can be connected to a ground potential. It should be appreciated that semiconductor component 140 may be configured for packaging in a package that conforms with through hole package outlines such as, for example, a TO-220 package, a TO-247 package, a TO-264 package, a TO-257 package, or the like.

Figure 12:
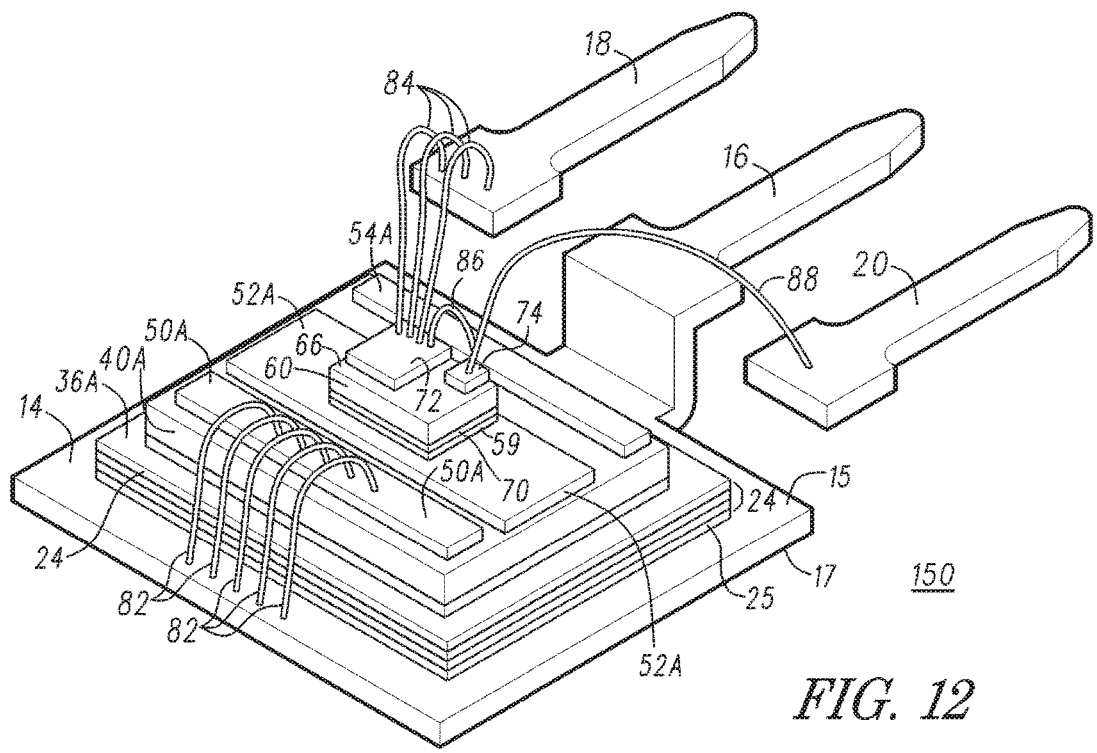
FIG. 12 is a perspective view of a semiconductor component in a cascode configuration in accordance with another embodiment of the present invention.

FIG. 12 is a perspective view of a semiconductor component 150 in accordance with another embodiment of the present invention. Semiconductor component 150 is similar to semiconductor component 10 except that drain contact 50 of semiconductor device 40 has been replaced by a drain contact 50A that is over a portion of an active area of III-N semiconductor device 40, source contact 52 has been replaced by a source contact 52A that is over another portion of the active area of III-N semiconductor device 40, and gate contacts 54 and 55 have been replaced by a gate contact 54A that is over another portion of the active area of III-N semiconductor device 40. A reference character A has been appended to reference characters 40, 50, 52, an 54 to distinguish a device having bond pads over an active area, i.e., III-N semiconductor device 40A, from a III-N semiconductor device without bondpads over the active area, e.g., III-N semiconductor device 40. Thus, semiconductor component 150 includes a III-N cascode switch in which the substrate of the III-N semiconductor material is floating and bond pads are formed over active regions or active areas of semiconductor device 40A.

Semiconductor component 150 may be represented schematically by circuit schematic 6 of FIG. 1. Thus, the substrate material of III-N semiconductor device 40A of semiconductor component 150 is floating, e.g., terminal 8B of III-N transistor 8 is open or floating. It should be appreciated that semiconductor component 150 may be configured for packaging in a package that conforms with through hole package outlines such as, for example, a TO-220 package, a TO-247 package, a TO-264 package, a TO-257 package, or the like.

Figure 13:
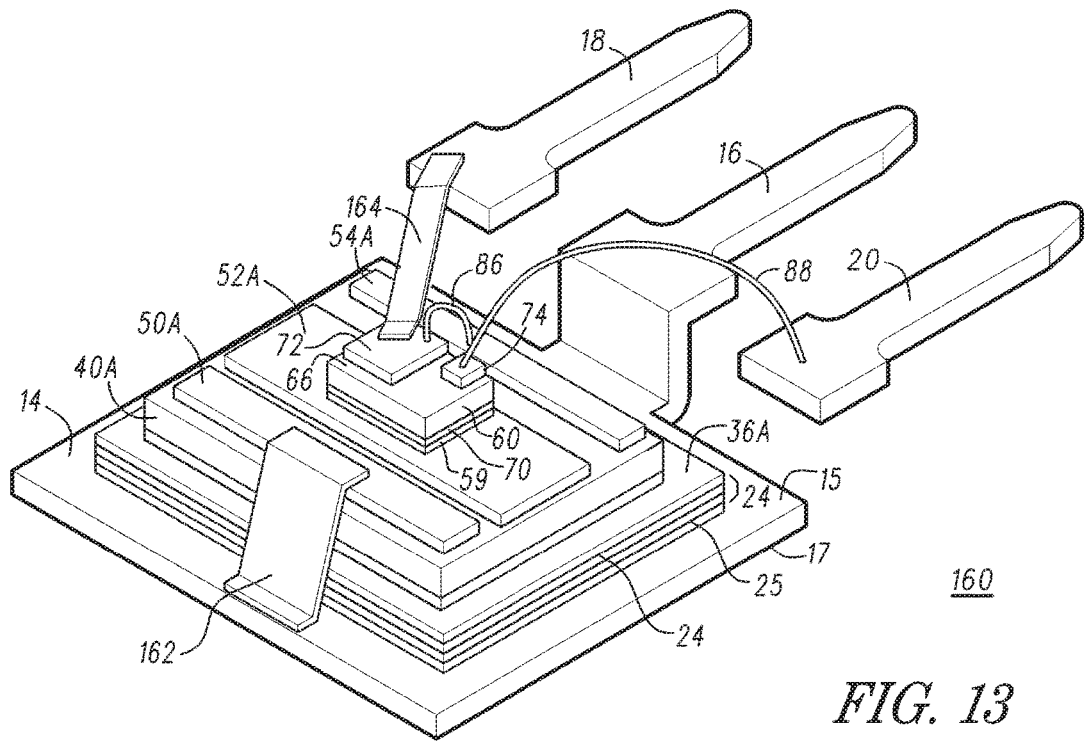
FIG. 13 is a perspective view of a semiconductor component in a cascode configuration in accordance with another embodiment of the present invention.

FIG. 13 is a perspective view of a semiconductor component 160 in accordance with another embodiment of the present invention. Semiconductor component 160 is similar to semiconductor component 150 except that bond wires 82 have been replaced by an electrically conductive clip 162 and bond wires 84 have been replaced by an electrically conductive clip 164. It should be noted that mounting semiconductor chip 40 to insulated metal substrate 24 and mounting semiconductor chip 60 to semiconductor chip 40 have been described with reference to FIGS. 3 and 4. Thus, semiconductor component 160 includes a III-N cascode switch in which the substrate of the III-N semiconductor material is electrically floating and bond pads are not formed over active regions of semiconductor device 40.

Semiconductor component 160 may be represented schematically by circuit schematic 6 of FIG. 1. Thus, the substrate material of III-N semiconductor device 40A of semiconductor component 160 is floating, e.g., terminal 8B of III-N transistor 8 is open or floating. It should be appreciated that semiconductor component 160 may be configured for packaging in a package that conforms with through hole package outlines such as, for example, a TO-220 package, a TO-247 package, a TO-264 package, a TO-257 package, or the like.

Figure 14:
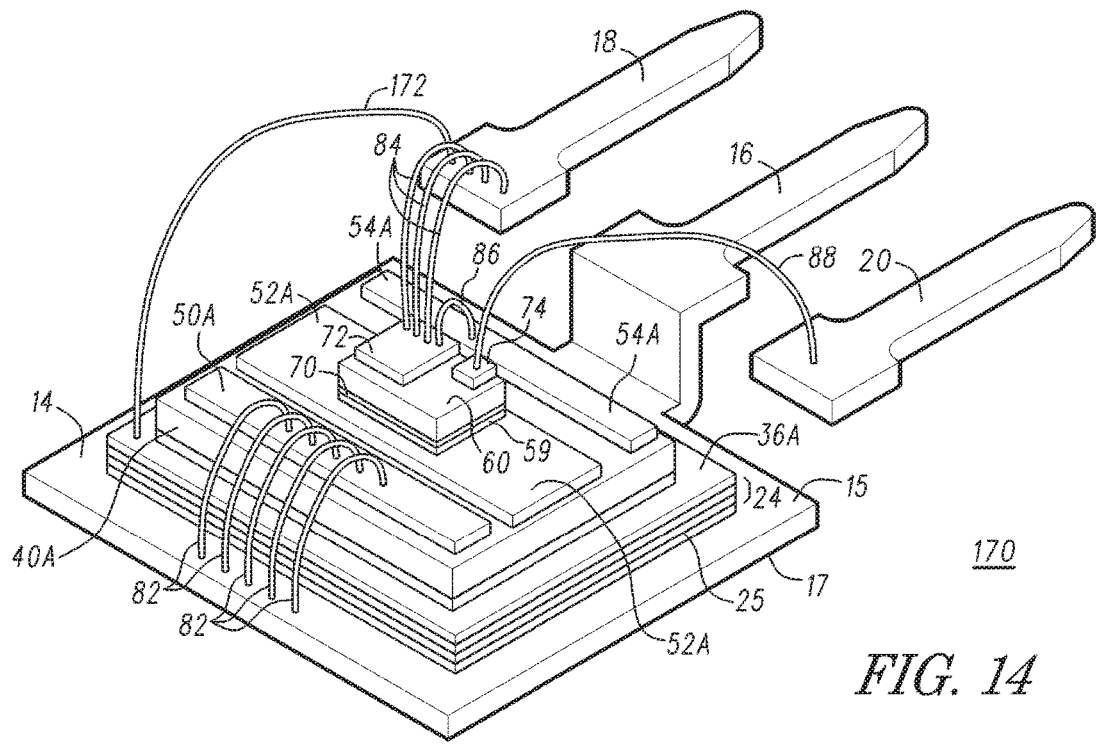
FIG. 14 is a perspective view of a semiconductor component in a cascode configuration in accordance with another embodiment of the present invention.

FIG. 14 is a perspective view of a semiconductor component 170 in accordance with another embodiment of the present invention. Semiconductor component 170 is similar to semiconductor component 150 except that semiconductor component 170 includes a bond wire 172 connecting surface 36A of insulated metal substrate 24 to leadframe lead 18. Bond wire 172 electrically connects source electrode 72, hence the source, of semiconductor device 60 to the body of semiconductor material of III-N semiconductor device 40. Thus, semiconductor component 170 includes a III-N cascode switch in which the substrate of the III-N semiconductor material is connected to the source electrode of semiconductor device 40 and bond pads are formed over active regions of semiconductor device 40. In accordance with embodiments, source electrode 72 of semiconductor device 60 can be connected to a desired potential. By way of example, source electrode 72 of semiconductor chip 60 is connected to ground.

Semiconductor component 170 may be represented schematically by circuit schematic 9 of FIG. 2. Thus, the substrate material of III-N semiconductor device 40A of semiconductor component 170, e.g., terminal 8B of III-N transistor 8 is electrically connected to source 7S of silicon transistor 7. In accordance with an embodiment, source 7S can be connected to a ground potential. It should be appreciated that semiconductor component 160 may be configured for packaging in a package that conforms with through hole package outlines such as, for example, a TO-220 package, a TO-247 package, a TO-264 package, a TO-257 package, or the like.

Figure 15:
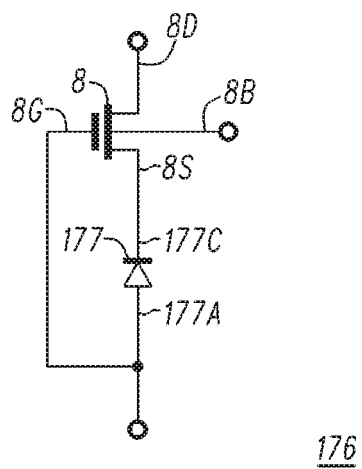
FIG. 15 is a circuit schematic of a semiconductor component in a cascode configuration, wherein a substrate of a III-N device is floating.

FIG. 15 is a circuit schematic 176 of a semiconductor component in a cascode configuration. The semiconductor component includes a diode 177 and transistor 8, where diode 177 has an anode 177A and a cathode 177C, and transistor 8 has a gate electrode 8G, a source electrode 8S, a drain electrode 8D, and a body terminal 8B. Source electrode 8S is electrically connected to cathode 177C and anode 177A is electrically connected to gate electrode 8G. Drain electrode 8D may be coupled for receiving a first source of operating potential for the cascode semiconductor component such as, for example, an operating potential $V_{DD}$, and anode 177A is coupled for the receiving a second source of operating potential such as, for example, an operating potential $V_{SS}$. By way of example, operating potential $V_{SS}$ is ground. It should be noted that the substrate or body 8B of III-N transistor 8 is floating, thus the semiconductor component may be referred to as being in a floating configuration or substrate floating configuration.

Figure 16:
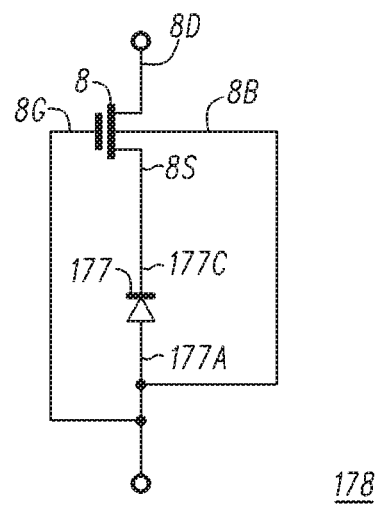
FIG. 16 is a circuit schematic of a semiconductor component in a cascode configuration, wherein a substrate of a III-N device is coupled to an anode electrode of a silicon semiconductor device.

FIG. 16 is a circuit schematic 178 of a semiconductor component in a cascode configuration. The semiconductor component includes diode 177 and transistor 8, where diode 177 has an anode 177A and a cathode 177C, and transistor 8 has a gate electrode 8G, a source electrode 8S, a drain electrode 8D, and a body terminal 8B. Source electrode 8S is electrically connected to cathode 177C and anode 177A is electrically connected to gate electrode 8G. Drain electrode 8D may be coupled for receiving a first source of operating potential for the cascode semiconductor component such as, for example, and operating potential $V_{DD}$, and anode 177A is coupled for the receiving a second source of operating potential for the cascoded semiconductor component such as, for example, an operating potential $V_{SS}$. By way of example, operating potential $V_{SS}$ is ground. Body terminal 8B of III-N transistor 8 is connected to anode 177A of diode 177. Thus, the substrate of III-N transistor 8 is coupled to the same potential as anode 177A. Anode 177A may be coupled for receiving a ground potential.

Figure 17:
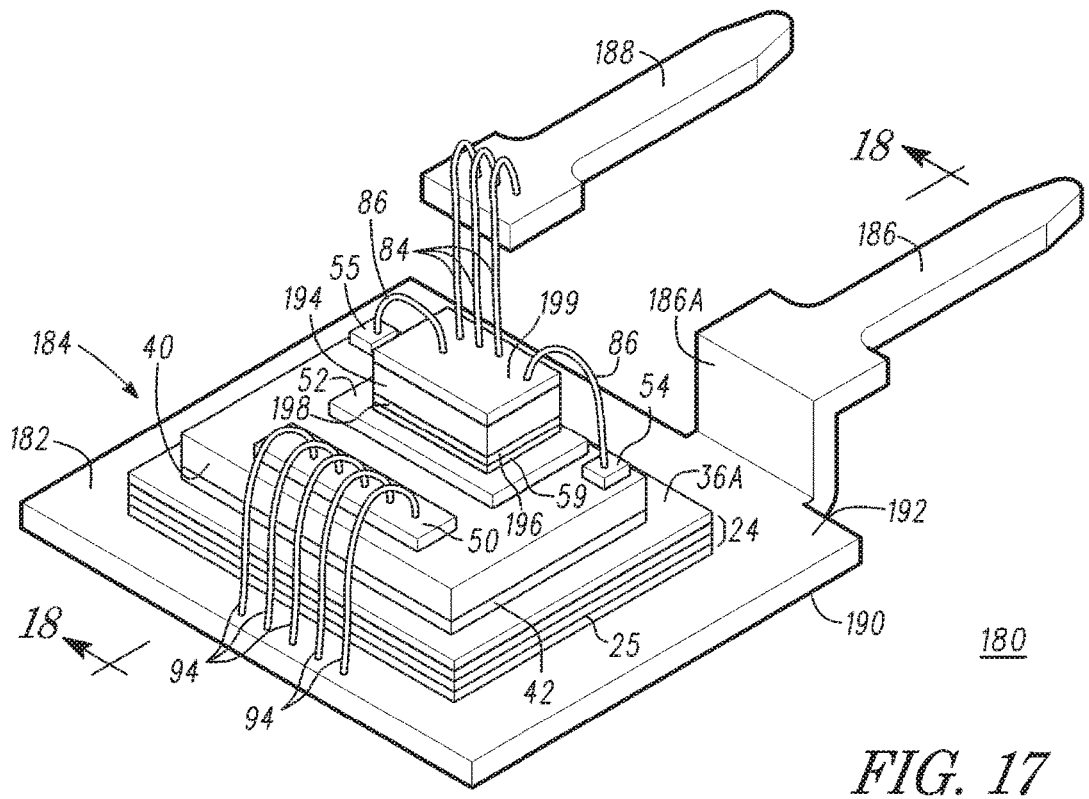
FIG. 17 is a perspective view of a semiconductor component in a cascode configuration in accordance with another embodiment of the present invention.
Figure 18:
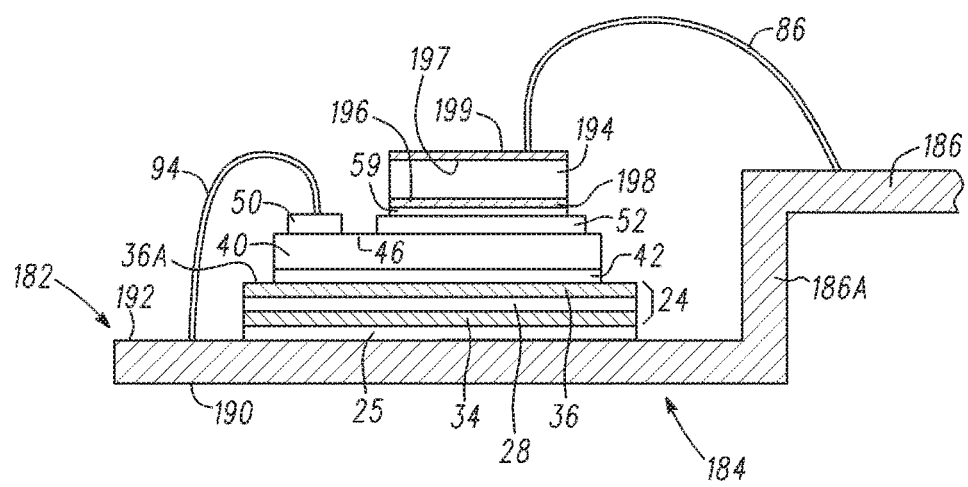
FIG. 18 is a cross-sectional view of the semiconductor component of FIG. 17 taken along section line 18-18 of FIG. 17.

FIG. 17 is a perspective view of a semiconductor component 180 in accordance with another embodiment of the present invention. FIG. 18 is a cross-sectional view of semiconductor component 180 taken along section line 18-18 of FIG. 17. Semiconductor component 180 is similar to semiconductor component 10 in that semiconductor chip 40 is mounted to insulated metal substrate 24, which is bonded to a device receiving area 182 of a leadframe 184 through die attach material 42, which die attach material has been described with reference to FIGS. 3 and 4. Leadframe 184 comprises device receiving area 182 and leadframe leads 186 and 188, wherein device receiving area 182 and leadframe lead 186 are integrally formed with each other, i.e., device receiving area 182 and leadframe lead 186 are derived from an electrically conductive material wherein a portion of the electrically conductive material serves as device receiving area 182 and another portion of the electrically conductive material serves as leadframe lead 186. Device receiving area 182 has opposing surfaces 190 and 192. In accordance with an embodiment, the electrically conductive material is copper. Leadframe lead 186 includes a connector portion 186A that connects leadframe lead 186 to device receiving area 182. Leadframe lead 188 is electrically isolated from leadframe lead 186. It should be noted that leadframe 184 is illustrated and described as a single element; however, it may be a portion singulated from a leadframe strip. Leadframe 184 conforms with through hole package outlines such as a TO-220 outline, a TO-247 outline, a TO-264 outline, a TO-257 outline, or the like.

Although an insulated metal substrate is described as being bonded to device receiving area 182 by electrically conductive material 25, this is not a limitation of the present invention. Alternatively, a layer of electrically insulating material may be formed on device receiving area 182 of leadframe 184. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

A semiconductor chip 194 having opposing surfaces 196 and 197 is bonded to source electrode 52 of III-N semiconductor device 40. In accordance with embodiments in which a discrete semiconductor device such as for example, a diode, is formed from semiconductor chip 194, semiconductor chip 194 may be referred to as a semiconductor device. By way of example, semiconductor device 194 is a diode having a cathode electrode 198 formed on surface 196 and an anode electrode 199 formed on surface 197. Semiconductor chip 194 is bonded to source contact 52 of III-N semiconductor device 40 using a bonding agent 59 such as solder, a conductive epoxy, an electrically conductive die attach material, or the like. Anode 199 of diode 194 is electrically connected to gate electrodes 54 and 55 of III-N semiconductor device 40 through bond wires 86 and to leadframe lead 188 through bond wires 84. Drain electrode 50 of III-N semiconductor device 40 is electrically connected to device receiving area 182 of leadframe 184 through bond wires 94. Thus, semiconductor component 180 includes a III-N cascode rectifier in which the substrate of the III-N semiconductor material is floating and bond pads are not formed over active regions of III-N semiconductor device 40.

Semiconductor component 180 may be represented schematically by circuit schematic 176 of FIG. 15. Thus, the substrate material of III-N semiconductor device 40 of semiconductor component 180 is floating, e.g., terminal 8B of III-N transistor 8 is open or floating. It should be appreciated that semiconductor component 180 may be configured for packaging in a package that conforms with through hole package outlines such as, for example, a TO-220 package, a TO-247 package, a TO-264 package, a TO-257 package, or the like.

Figure 19:
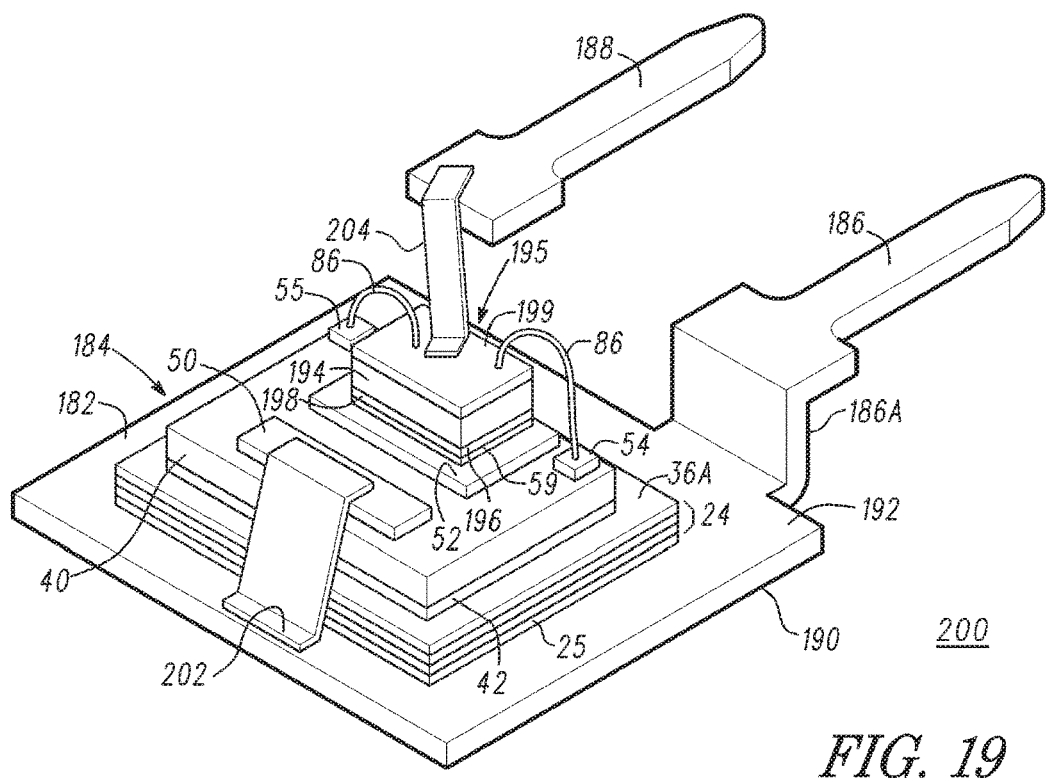
FIG. 19 is a perspective view of a semiconductor component in a cascode configuration in accordance with another embodiment of the present invention.

FIG. 19 is a perspective view of a semiconductor component 200 in accordance with another embodiment of the present invention. Semiconductor component 200 is similar to semiconductor component 180 except that bond wires 94 have been replaced by an electrically conductive clip 202 and bond wires 84 have been replaced by an electrically conductive clip 204. Semiconductor component 200 includes a III-N cascode switch in which the substrate of the III-N semiconductor material is electrically floating and bond pads are not formed over active areas or active regions of semiconductor device 40.

Semiconductor component 200 may be represented schematically by circuit schematic 176 of FIG. 15. Thus, the substrate material of III-N semiconductor device 40 of semiconductor component 200 is floating, e.g., terminal 8B of III-N transistor 8 is open or floating. It should be appreciated that semiconductor component 180 may be configured for packaging in a package that conforms with through hole package outlines such as, for example, a TO-220 package, a TO-247 package, a TO-264 package, a TO-257 package, or the like.

Figure 20:
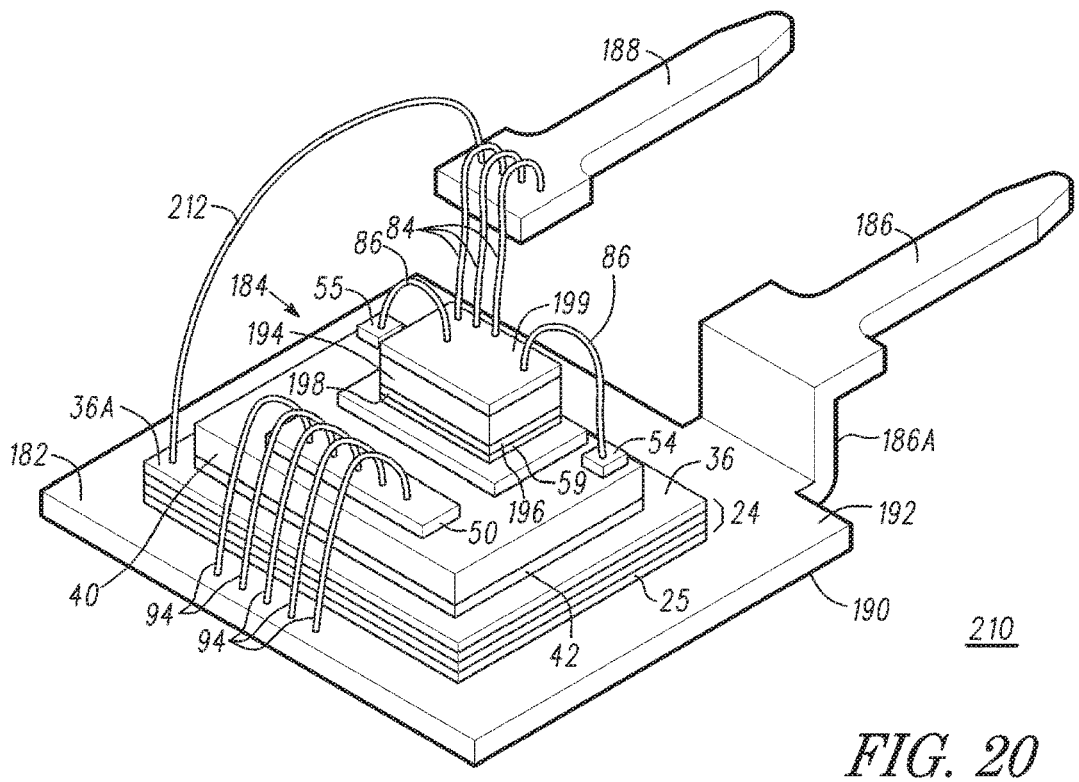
FIG. 20 is a perspective view of a semiconductor component in a cascode configuration in accordance with another embodiment of the present invention.

FIG. 20 is a perspective view of a semiconductor component 210 in accordance with another embodiment of the present invention. Semiconductor component 210 is similar to semiconductor component 180 except that semiconductor component 210 includes a bond wire 212 connecting surface 36A of insulated metal substrate 24 to leadframe lead 188. Bond wires 84 and 212 electrically connect anode 199 to the body of the semiconductor material of III-N semiconductor device 40. Thus, semiconductor component 210 includes a III-N cascode switch in which the substrate of the III-N semiconductor material of III-N semiconductor device 40 is shorted to the anode of diode 194 and bond pads are not formed over active regions of semiconductor device 40.

Semiconductor component 210 may be represented schematically by circuit schematic 178 of FIG. 16. Thus, the substrate material of III-N semiconductor device 40 of semiconductor component 180 is electrically connected to anode 199 of diode 194, e.g., terminal 8B of III-N transistor 8 is connected to anode 177A of diode 177. It should be appreciated that semiconductor component 180 may be configured for packaging in a package that conforms with through hole package outlines such as, for example, a TO-220 package, a TO-247 package, a TO-264 package, a TO-257 package, or the like.

Figure 21:
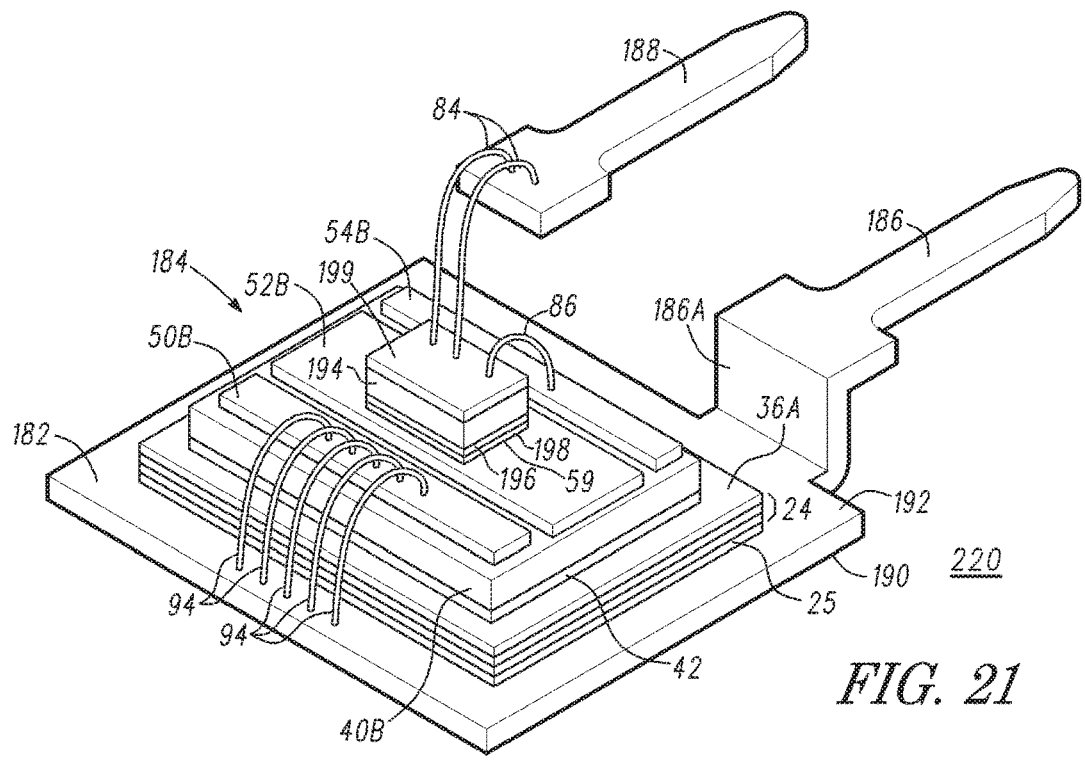
FIG. 21 is a perspective view of a semiconductor component in a cascode configuration in accordance with another embodiment of the present invention.

FIG. 21 is a perspective view of a semiconductor component 220 in accordance with another embodiment of the present invention. Semiconductor component 220 is similar to semiconductor component 180 except that the drain contact of the semiconductor device is over a portion of an active area the III-N semiconductor device, the source contact is over another portion of the active area of the III-N semiconductor device, and the drain contact is over yet another portion of the active area of the III-N semiconductor device. Thus, the reference character B has been appended to reference characters 40, 50, 52, and 54 to distinguish the configurations of the semiconductor devices of FIGS. 1-20 from that of FIG. 21. More particularly, a drain contact 50B of semiconductor device 40B is over a portion of an active area of III-N semiconductor device 40B, source contact 52B is over another portion of the active area of III-N semiconductor device 40B, and gate contacts 54 and 55 have been replaced by a gate contact 54B that is over another portion of the active area of III-N semiconductor device 40B. Thus, semiconductor component 220 includes a III-N cascode switch in which the substrate of the III-N semiconductor material is floating and bond pads are formed over active regions of semiconductor device 40B.

Semiconductor component 220 may be represented schematically by circuit schematic 176 of FIG. 15. Thus, the substrate material of III-N semiconductor device 40B of semiconductor component 220 is floating, e.g., terminal 8B of III-N transistor 8 is open or floating. It should be appreciated that semiconductor component 220 may be configured for packaging in a package that conforms with through hole package outlines such as, for example, a TO-220 package, a TO-247 package, a TO-264 package, a TO-257 package, or the like.

Figure 22:
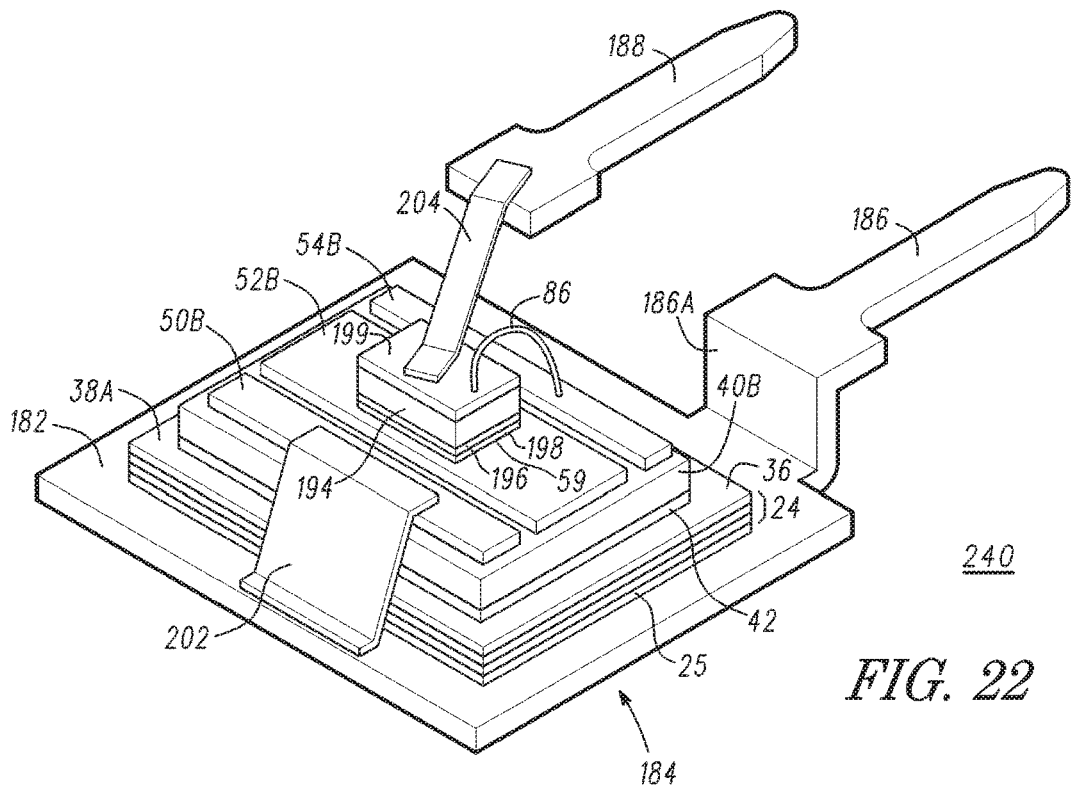
FIG. 22 is a perspective view of a semiconductor component in a cascode configuration in accordance with another embodiment of the present invention.

FIG. 22 is a perspective view of a semiconductor component 240 in accordance with another embodiment of the present invention. Semiconductor component 240 is similar to semiconductor component 220 except that bond wires 94 have been replaced by an electrically conductive clip 202 and bond wires 84 have been replaced by an electrically conductive clip 204. It should be noted that mounting a semiconductor chip to insulated metal substrate 24 and mounting a semiconductor chip to another semiconductor chip have been described with reference to FIGS. 3 and 4. Semiconductor component 240 includes a III-N cascode switch in which the substrate of the III-N semiconductor material is electrically floating and bond pads are formed over active regions of semiconductor device 40B.

Semiconductor component 240 may be represented schematically by circuit schematic 176 of FIG. 15. Thus, the substrate material of III-N semiconductor device 40B of semiconductor component 240 is floating, e.g., terminal 8B of III-N transistor 8 is open or floating. It should be appreciated that semiconductor component 240 may be configured for packaging in a package that conforms with through hole package outlines such as, for example, a TO-220 package, a TO-247 package, a TO-264 package, a TO-257 package, or the like.

Figure 23:
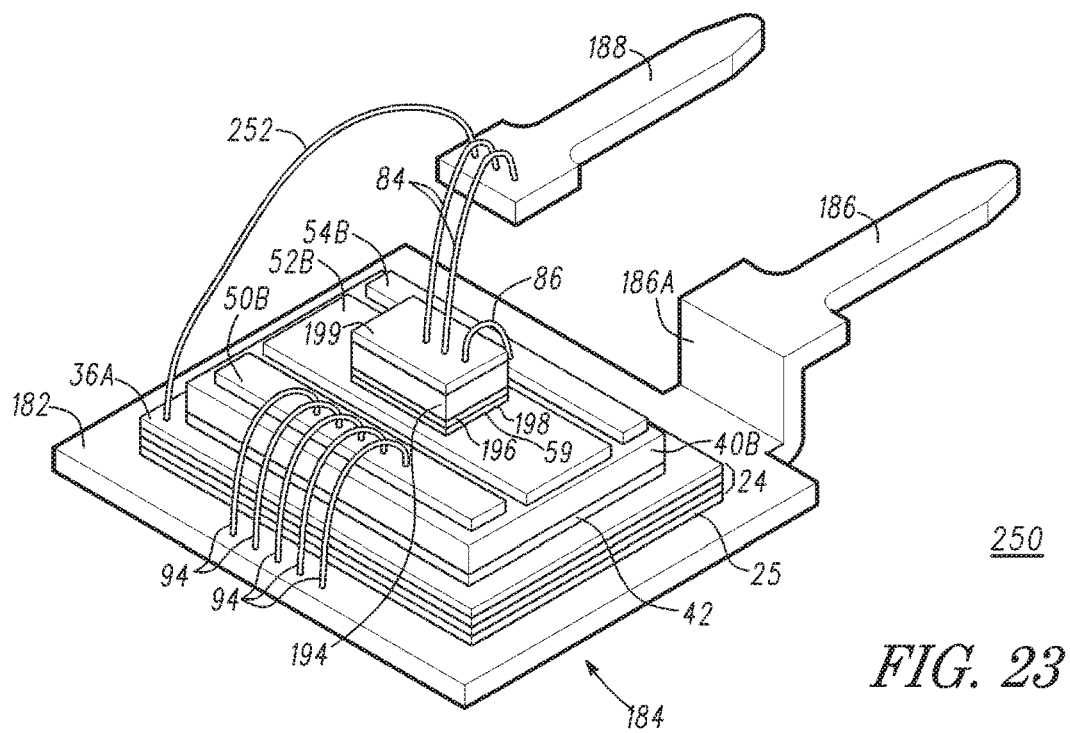
FIG. 23 is a perspective view of a semiconductor component in a cascode configuration in accordance with another embodiment of the present invention.

FIG. 23 is a perspective view of a semiconductor component 250 in accordance with another embodiment of the present invention. Semiconductor component 250 is similar to semiconductor component 220 except that semiconductor component 250 includes a bond wire 252 connecting surface 38A of insulated metal substrate 24 to leadframe lead 188. Surface 38A of insulated metal substrate 24 is electrically connected to anode 199 through bond wire 252, bond wires 84, and leadframe lead 188, i.e., anode 199 is electrically connected to the semiconductor material of III-N semiconductor device 40B through bond wire 252, and bond wires 84, and leadframe lead 188. It should be noted that anode 199 may be referred to as anode contact 199. Thus, semiconductor component 250 includes a III-N cascode switch in which the substrate of the III-N semiconductor material is connected to anode 199 of diode 194 and bond pads are formed over active regions of semiconductor device 40B.

Semiconductor component 250 may be represented schematically by circuit schematic 178 of FIG. 16. Thus, the substrate material of III-N semiconductor device 40 of semiconductor component 180 is electrically connected to the anode of diode 194, e.g., terminal 8B of III-N transistor 8 is connected to anode 177A of diode 177. It should be appreciated that semiconductor component 250 may be configured for packaging in a package that conforms with through hole package outlines such as, for example, a TO-220 package, a TO-247 package, a TO-264 package, a TO-257 package, or the like.

Figure 24:
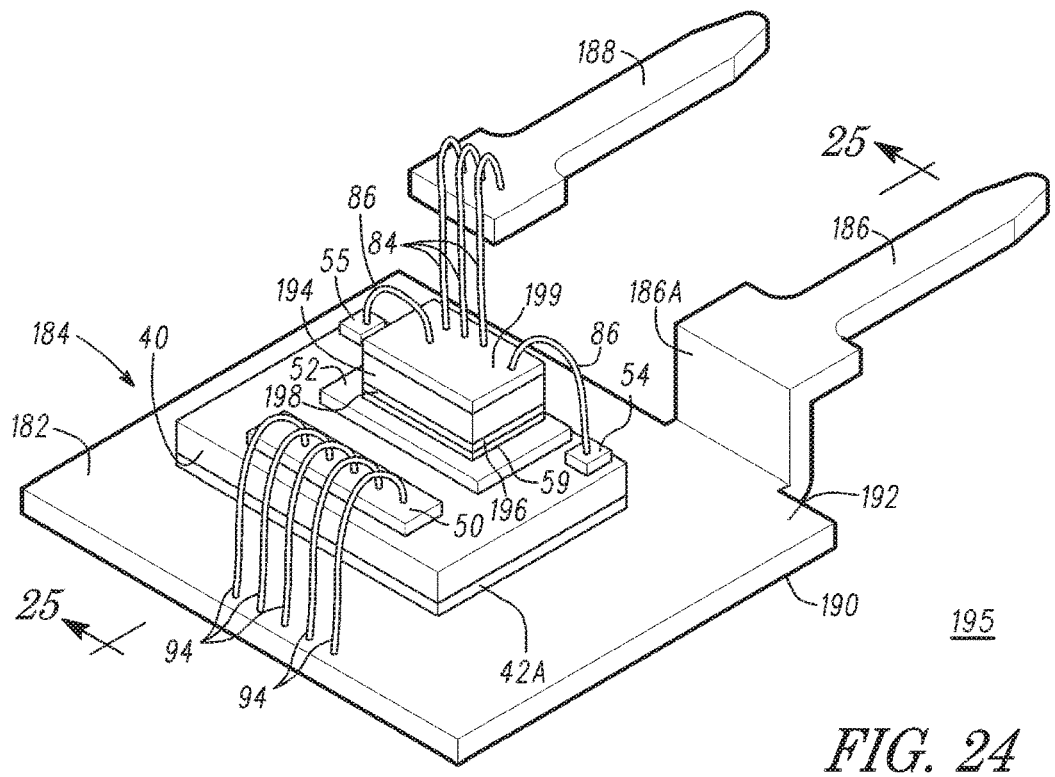
FIG. 24 is a perspective view of a semiconductor component in a cascode configuration in accordance with another embodiment of the present invention.
Figure 25:
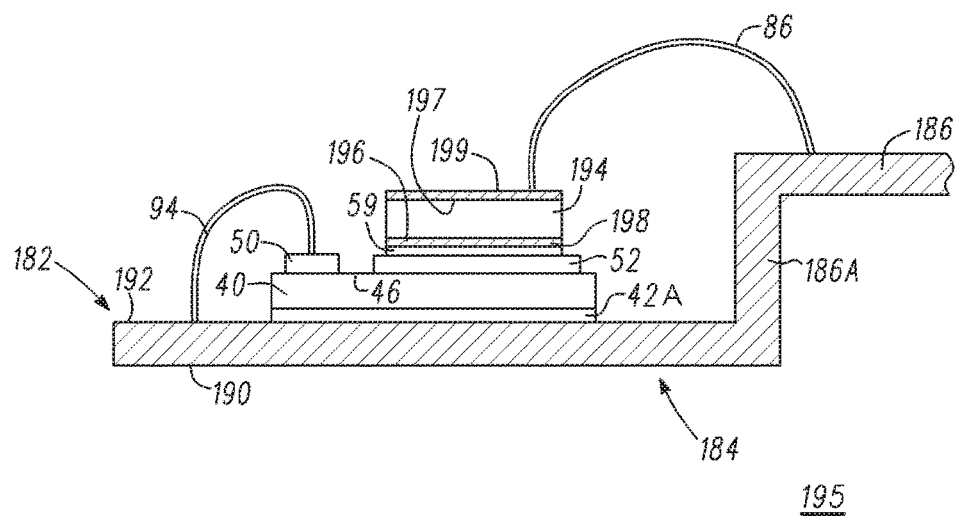
FIG. 25 is a cross-sectional view of the semiconductor component of FIG. 24 taken along section line 25-25 of FIG. 24.

FIG. 24 is a perspective view of a semiconductor component 195 in accordance with an embodiment of the present invention and FIG. 25 is a cross-sectional view of semiconductor component 195 taken along section line 25-25 of FIG. 24. It should be noted that FIGS. 24 and 25 are described together. What is shown in FIGS. 24 and 25 is a leadframe 184 comprising a device receiving area 182 and leadframe leads 186 and 188, wherein device receiving area 182 and leadframe lead 186 are integrally formed with each other, i.e., device receiving area 182 and leadframe lead 186 are derived from an electrically conductive material wherein a portion of the electrically conductive material serves as device receiving area 182 and another portion of the electrically conductive material serves as leadframe lead 186. Device receiving area 182 has opposing surfaces 190 and 192. In accordance with an embodiment, the electrically conductive material is copper and the portion of the electrically conductive material that includes device receiving area 182 is formed in a plane and the portion of the electrically conductive material that includes leadframe lead 186 is formed in another plane that is different from the plane that includes device receiving area 182. Thus, device receiving area 182 and leadframe lead 186 are not co-planar. Leadframe lead 186 includes a connector portion 186A that connects leadframe lead 186 to device receiving area 182. Leadframe lead 186 and 188 are coplanar. It should be noted that leadframe 184 is illustrated and described as a single element; however, it may be a portion singulated from a leadframe strip and that leadframe 184 conforms with through hole package outlines such as a TO-220 outline, a TO-247 outline, a TO-264 outline, a TO-257 outline, or the like.

A semiconductor chip 40 is bonded to a portion of the die receiving area 182 using an electrically insulating die attach material 42A. In accordance with an embodiment, semiconductor chip 40 is a compound semiconductor chip having opposing major surfaces 44 and 46, wherein semiconductor chip 40 includes a field effect semiconductor device having a drain contact 50 formed on surface 46, a source contact 52 formed on a portion of surface 46, and gate contacts 54 and 55 formed on other portions of surface 46. In accordance with embodiments in which a discrete semiconductor device such as for example, a field effect transistor, is formed from semiconductor chip 40, semiconductor chip 40 may be referred to as a semiconductor device. It should be noted that semiconductor device 40 is not limited to being a vertical field effect transistor or a field effect transistor. For example, semiconductor device 40 may be an insulated gate bipolar transistor, a bipolar transistor, a junction field effect transistor, a diode, or the like. It should be further noted that the semiconductor material of semiconductor chip 40 may include III-N semiconductor materials such as, for example, gallium nitride, or it may include a III-V semiconductor material, a II-VI semiconductor material, or the like.

A semiconductor chip 194 having opposing surfaces 196 and 197 is bonded to source electrode 52 of III-N semiconductor device 40. In accordance with embodiments in which a discrete semiconductor device such as for example, a diode, is formed from semiconductor chip 194, semiconductor chip 194 may be referred to as a semiconductor device. By way of example, semiconductor device 194 is a diode having a cathode electrode 198 formed on surface 196 and an anode electrode 199 formed on surface 197. Semiconductor chip 194 is bonded to source contact 52 of III-N semiconductor device 40 using a bonding agent 59 such as solder, a conductive epoxy, an electrically conductive die attach material, or the like. Anode 199 of diode 194 is electrically connected to gate electrodes 54 and 55 of III-N semiconductor device 40 through bond wires 86 and to leadframe lead 188 through bond wires 84. Drain electrode 50 of III-N semiconductor device 40 is electrically connected to device receiving area 182 of leadframe 184 through bond wires 94. Thus, semiconductor component 195 includes a III-N cascode rectifier in which the substrate of the III-N semiconductor material is floating and bond pads are not formed over active regions of III-N semiconductor device 40.

Semiconductor component 195 may be represented schematically by circuit schematic 176 of FIG. 15. Thus, the substrate material of III-N semiconductor device 40 of semiconductor component 195 is floating, e.g., terminal 8B of III-N transistor 8 is open or floating. It should be appreciated that semiconductor component 195 may be configured for packaging in a package that conforms with through hole package outlines such as, for example, a TO-220 package, a TO-247 package, a TO-264 package, a TO-257 package, or the like.

Figure 26:
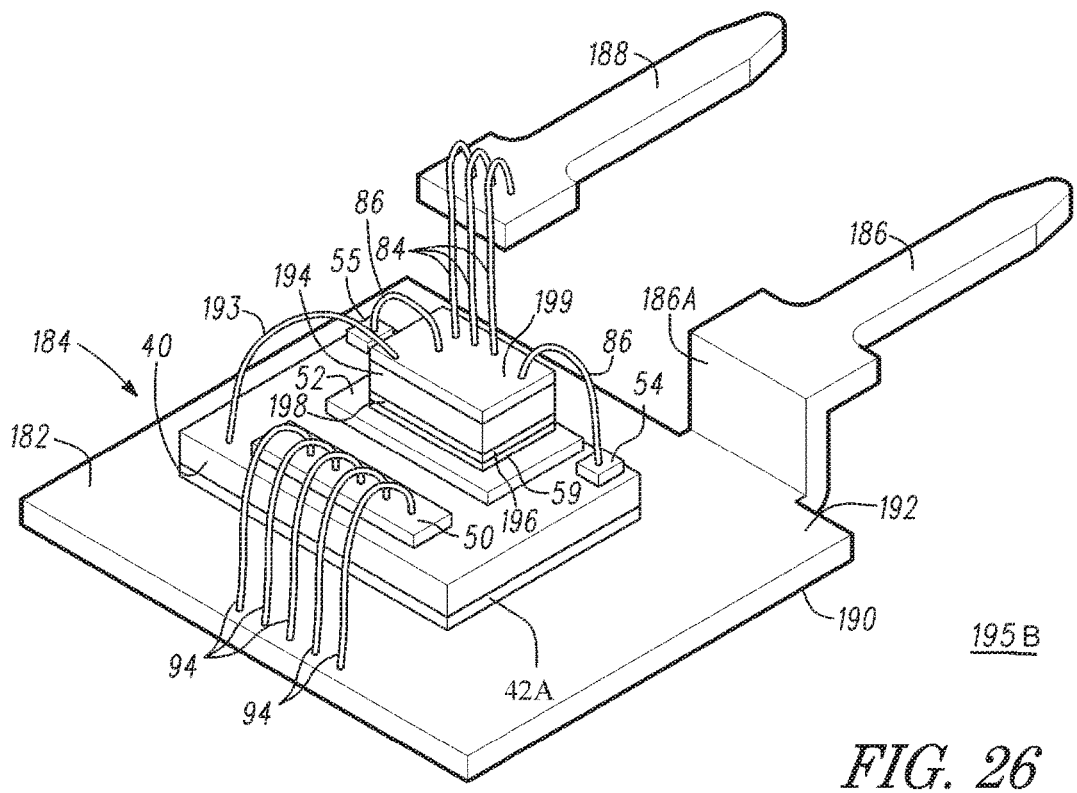
FIG. 26 is a perspective view of a semiconductor component in a cascode configuration in accordance with another embodiment of the present invention.

FIG. 26 is a perspective view of a semiconductor component 195B in accordance with an embodiment of the present invention. Semiconductor component 195B is similar to semiconductor component 195 of FIGS. 24 and 25, with the addition of a bond wire 193 electrically coupling the substrate of III-N semiconductor chip 40 to anode 199 of semiconductor chip 194, i.e., diode 194, and to the gate of III-N semiconductor chip 40.

Semiconductor component 195B may be represented schematically by circuit schematic 178 of FIG. 16. Thus, the substrate material of III-N semiconductor device 40 of semiconductor component 195B is floating, e.g., terminal 8B of III-N transistor 8 is open or floating. It should be appreciated that semiconductor component 195B may be configured for packaging in a package that conforms with through hole package outlines such as, for example, a TO-220 package, a TO-247 package, a TO-264 package, a TO-257 package, or the like.

Figure 27:
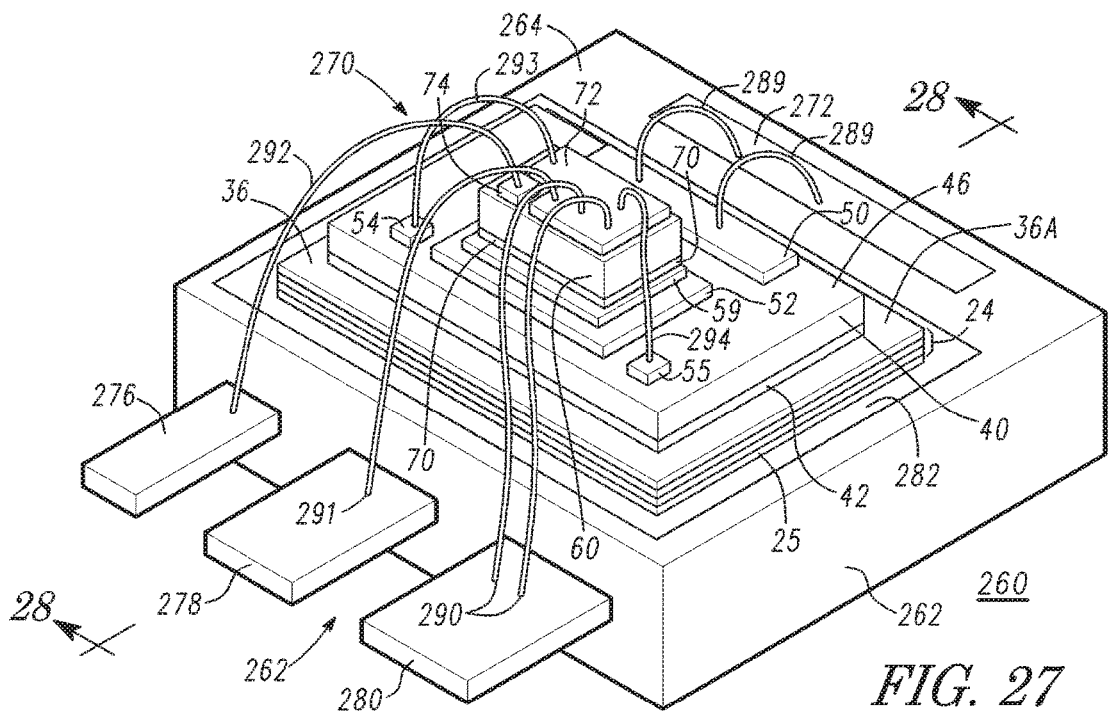
FIG. 27 is a perspective view of a semiconductor component in a cascode configuration in accordance with another embodiment of the present invention.
Figure 28:
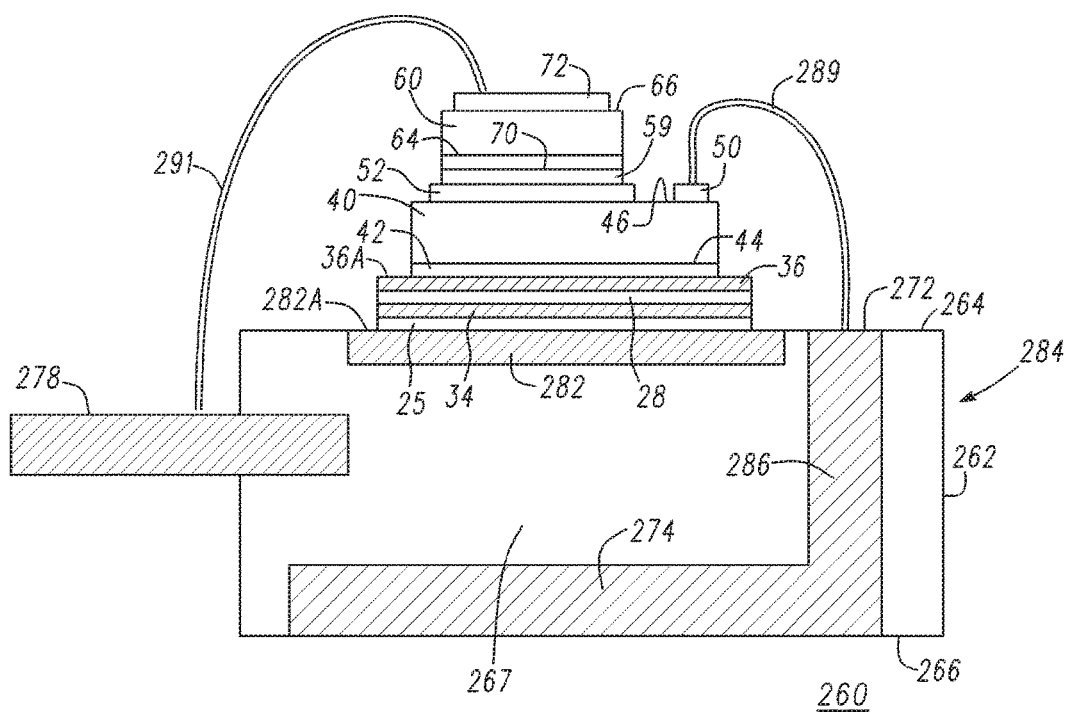
FIG. 28 is a cross-sectional view of the semiconductor component of FIG. 27 taken along section line 28-28 of FIG. 27.
Figure 29:
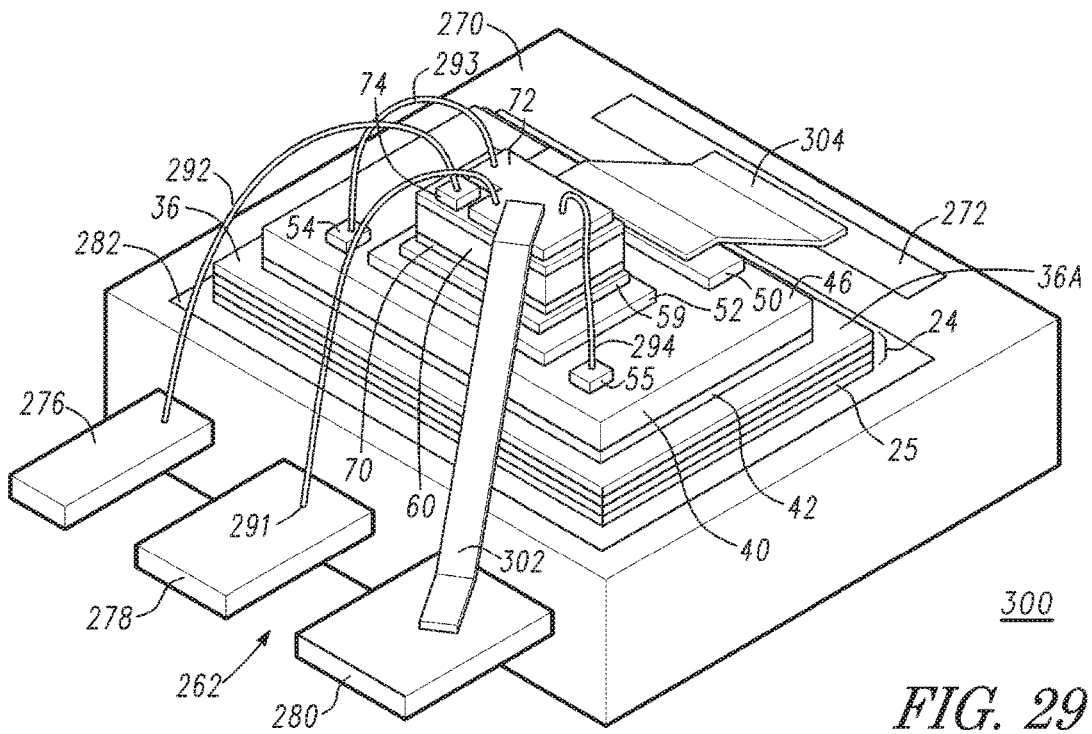
FIG. 29 is a perspective view of a semiconductor component in a cascode configuration in accordance with another embodiment of the present invention.

FIG. 27 is a perspective view of a semiconductor component 260 in accordance with another embodiment of the present invention and FIG. 28 is a cross-sectional view of semiconductor component 260 taken along section line 28-28 of FIG. 27. It should be noted that FIGS. 27 and 28 are described together. What is shown in FIGS. 27 and 28 are a molded device support structure 262 having a top surface 264 and a bottom surface 266, and a mold compound 267 between portions of top surface 264 and bottom surface 266. Molded support structure 262 includes a device receiving area 270, a bond pad 272 at top surface 264, and a contact 274 at bottom surface 266. Bond pad 272 may be referred to as an interconnect structure. Leadframe leads 276, 278, and 280 protrude from a side or an edge of molded device support structure 262. Molded device support structure 262 may be formed by placing an electrically conductive strip in a mold having a mold cavity and injecting a mold compound into the mold cavity. The electrically conductive strip may include a pad or plate 282 that serves as a device receiving area, an interconnect structure 284 that includes bond pad 272 integrally formed with contact 274 through a conductor 286, and a plurality of leadframe leads such as, for example, leadframe leads 276, 278, and 280. After injecting the mold compound into the cavities, the electrically conductive strip may be singulated into a plurality of molded support structures 262. Suitable materials for the electrically conductive strips include copper, aluminum, or the like. As mentioned, molded support structure 262 is illustrated and described as a single element; however, it may be a portion singulated from a leadframe strip encapsulated in a mold compound.

An insulated metal substrate 24 is bonded to surface 282A of device receiving area 282 using a die attach material 25. Insulated metal substrate 24 and die attach material 25 have been described with reference to FIGS. 3 and 4. A semiconductor chip 40 is bonded to surface 36A of insulated metal substrate 24 using a die attach material 42, wherein die attach material 42 is an electrically and thermally conductive die attach material. Suitable materials for die attach material 42 may be the same as the materials of die attach material 25. In accordance with an embodiment, semiconductor chip 40 is a compound semiconductor chip having opposing major surfaces 44 and 46, wherein semiconductor chip 40 includes a field effect semiconductor device having a drain contact 50 formed on a portion of surface 46, a source contact 52 formed on another portion of surface 46, and gate contacts 54 and 55 formed on other portions of surface 46. In accordance with embodiments in which a discrete semiconductor device such as for example, a field effect transistor, is formed from semiconductor chip 40, semiconductor chip 40 may be referred to as a semiconductor device. It should be noted that semiconductor device 40 is not limited to being a field effect transistor. For example, semiconductor device 40 may be an insulated gate bipolar transistor, a bipolar transistor, a junction field effect transistor, a diode, or the like.

Although an insulated metal substrate is described as being bonded to device receiving area 282A, this is not a limitation of the present invention. Alternatively, a layer of electrically insulating material may be formed on device receiving area 282A of leadframe 282. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

A semiconductor chip 60 is bonded to or mounted on semiconductor chip 40 using a bonding agent 59, which bonding agent may be a thermally and electrically conductive material. More particularly, semiconductor chip 60 is bonded to source contact 52. In accordance with an embodiment, semiconductor chip 60 is a silicon chip having opposing major surfaces 64 and 66, wherein semiconductor chip 60 includes a vertical field effect semiconductor device having a drain contact 70 formed on surface 64, a source contact 72 formed on a portion of surface 66, and a gate contact 74 formed on another portion of surface 66. Drain contact 70 is bonded to source contact 52 of semiconductor device 40 through die attach material 59. It should be noted that semiconductor device 60 is not limited to being a vertical field effect transistor or a field effect transistor. For example, semiconductor device 60 may be an insulated gate bipolar transistor, a bipolar transistor, a junction field effect transistor, a diode, or the like. In accordance with embodiments in which a discrete semiconductor device such as for example, a field effect transistor, is formed from semiconductor chip 60, semiconductor chip 60 may be referred to as a semiconductor device.

Drain bond pad 50 of semiconductor device 40 is electrically connected to bond pad 272 through bond wires 289. Source bond pad 72 of semiconductor device 60 is electrically connected to leadframe lead 280 through bond wires 290 and to leadframe lead 278 through bond wire 291. Gate bond pad 74 of semiconductor device 60 is electrically connected to leadframe lead 276 through a bond wire 292. Gate bond pad 54 is electrically connected to source bond pad 72 through a bond wire 293 and gate bond pad 55 is electrically connected to source bond pad 72 through a bond wire 294. Gate bond pad 54 is electrically connected to gate bond pad 55 through a metallization system, not shown. Bond wires may be referred to as wirebonds.

As those skilled in the art are aware, insulated metal substrate 24, semiconductor chips 40 and 60, and bond wires 289, 290, 291, 292, 293, and 294, and portions of leadframe 262 are encapsulated in a protection material such as, for example a mold compound. It should be noted that a portion of contact 274 may not be covered or protected by the mold compound.

Thus, semiconductor component 260 includes a III-N cascode switch in which the semiconductor material of the III-N semiconductor device is electrically floating and bond pads are not formed over active regions of semiconductor device 40. Semiconductor component 260 may be represented schematically by circuit schematic 6 of FIG. 1. Thus, the substrate material of III-N semiconductor device 40 of semiconductor component 260 is floating, e.g., terminal 8B of III-N transistor 8 is open or floating. It should be appreciated that semiconductor component 260 may be configured for packaging in a package that conforms with through hole package outlines such as, for example, a TO-220 package, a TO-247 package, a TO-264 package, a TO-257 package, or the like.

FIG. 28 is a perspective view of a semiconductor component 300 in accordance with another embodiment of the present invention. Semiconductor component 300 is similar to semiconductor component 260 except that bond wires 290 have been replaced by an electrically conductive clip 302 and bond wires 289 have been replaced by an electrically conductive clip 304. Thus, semiconductor component 300 includes a III-N cascode switch in which the substrate of the III-N semiconductor material is electrically floating and bond pads are formed over active regions of semiconductor device 40.

Figure 30:
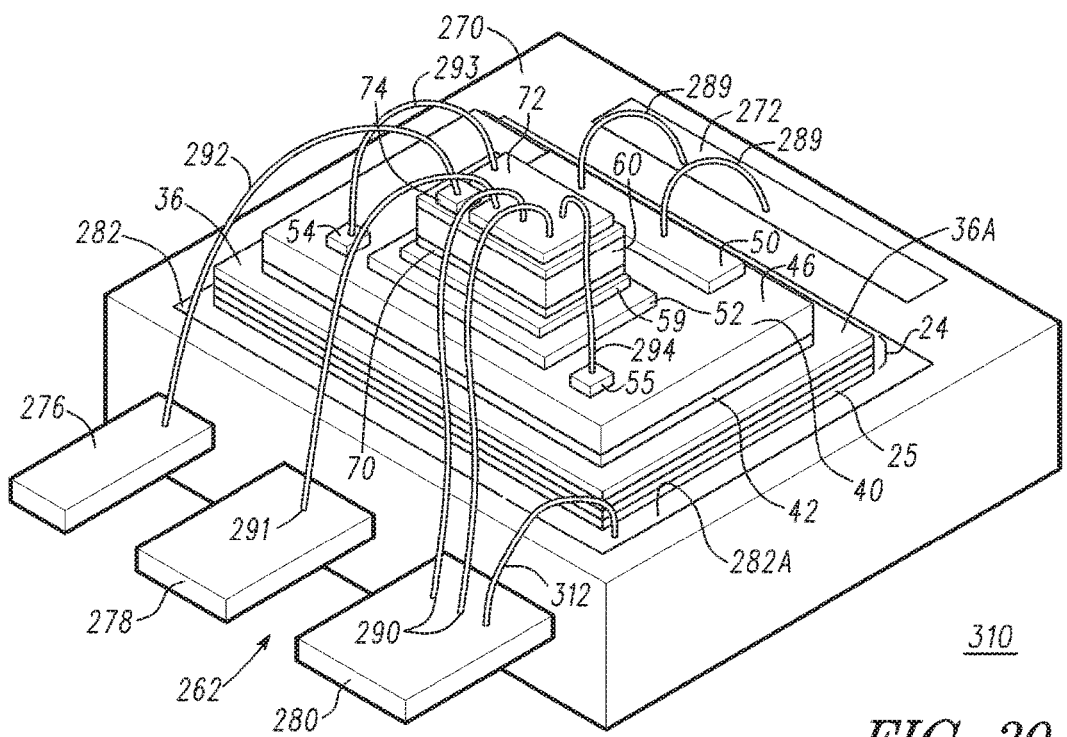
FIG. 30 is a perspective view of a semiconductor component in a cascode configuration in accordance with another embodiment of the present invention.

FIG. 30 is a perspective view of a semiconductor component 310 in accordance with another embodiment of the present invention. Semiconductor component 310 is similar to semiconductor component 300 except that semiconductor component 310 includes a bond wire 312 connecting surface 282A of pad 282 to leadframe lead 280. Bond wire 312 electrically connects source contact 72 of semiconductor device 60 to pad 282 which may be set to ground. Thus, semiconductor component 310 includes a III-N cascode switch in which the substrate of the III-N semiconductor material is connected to a source of silicon semiconductor device 60 grounded and bond pads are not formed over active regions of semiconductor device 40.

Semiconductor component 310 may be represented schematically by circuit schematic 9 of FIG. 2. Thus, the substrate material of III-N semiconductor device 40 of semiconductor component 310 is electrically connected to the source of silicon semiconductor device 60, e.g., terminal 8B of III-N transistor 8 is electrically connected to source 7S of silicon transistor 7. In accordance with an embodiment, source 7S can be connected to a potential such as, for example, a ground potential. It should be appreciated that semiconductor component 160 may be configured for packaging in a package that conforms with through hole package outlines such as, for example, a TO-220 package, a TO-247 package, a TO-264 package, a TO-257 package, or the like.

Figure 31:
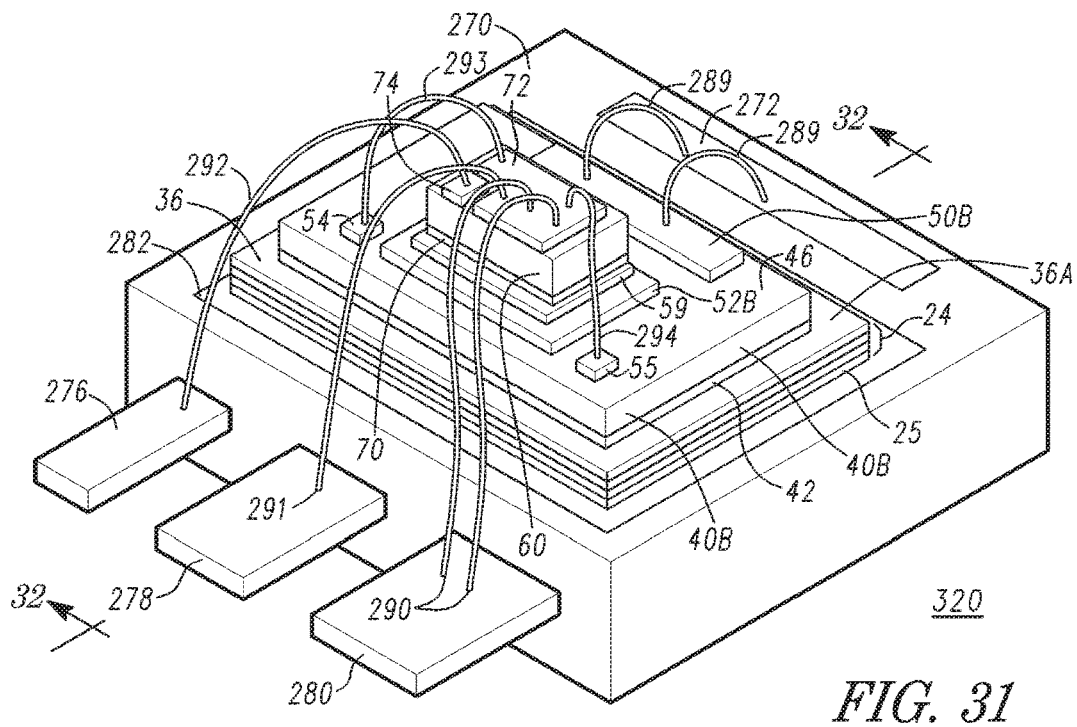
FIG. 31 is a perspective view of a semiconductor component in a cascode configuration in accordance with another embodiment of the present invention.
Figure 32:
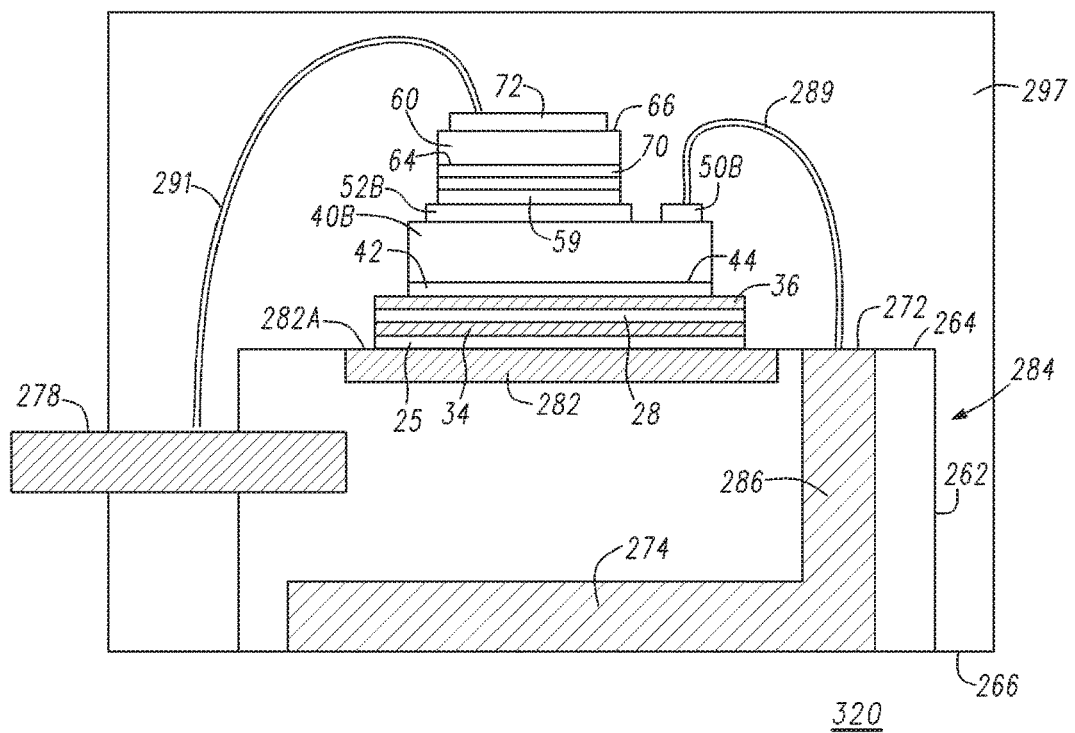
FIG. 32 is a cross-sectional view of the semiconductor component of FIG. 31 taken along section line 32-32 of FIG. 31.

FIG. 31 is a perspective view of a semiconductor component 320 in accordance with another embodiment of the present invention. FIG. 32 is a cross-sectional view of semiconductor component 320 taken along section line 32-32 of FIG. 31. Semiconductor component 320 is similar to semiconductor component 260 except that drain contact 50 of semiconductor device 40 has been replaced by a drain contact 50B that is over a portion of an active area of III-N semiconductor device 40B and source contact 52 has been replaced by a source contact 52B that is over another portion of the active area of III-N semiconductor device 40. Reference character B has been appended to reference characters 40, 50, and 52 to distinguish the configurations of the semiconductor devices of semiconductor components 260 and 320. More particularly, a drain contact 50B of semiconductor device 40B is over a portion of an active area of III-N semiconductor device 40B, source contact 52B is over another portion of the active area of III-N semiconductor device 40B. Thus, semiconductor component 320 includes a III-N cascode switch in which the substrate of the III-N semiconductor material is floating and bond pads are formed over active regions of semiconductor device 40B.

Semiconductor component 320 may be represented schematically by circuit schematic 6 of FIG. 1. Thus, the substrate material of III-N semiconductor device 40 of semiconductor component 320 is floating, e.g., terminal 8B of III-N transistor 8 is open or floating. It should be appreciated that semiconductor component 320 may be configured for packaging in a package that conforms with through hole package outlines such as, for example, a TO-220 package, a TO-247 package, a TO-264 package, a TO-257 package, or the like.

Figure 33:
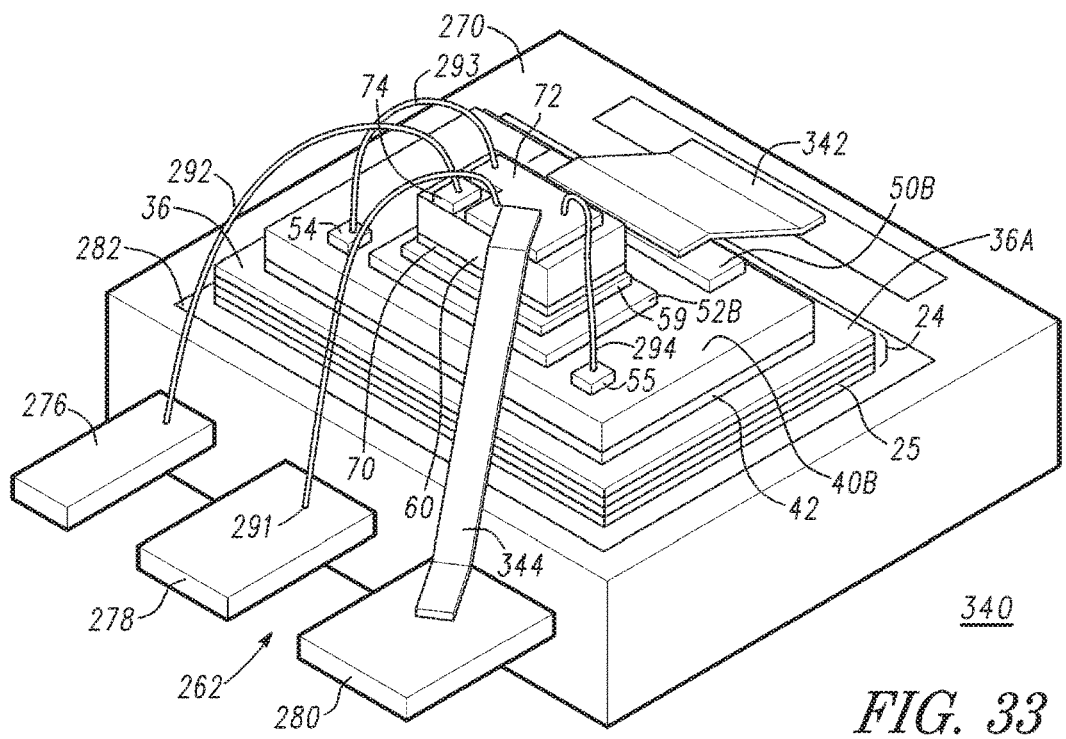
FIG. 33 is a perspective view of a semiconductor component in a cascode configuration in accordance with another embodiment of the present invention.

FIG. 33 is a perspective view of a semiconductor component 340 in accordance with another embodiment of the present invention. Semiconductor component 340 is similar to semiconductor component 320 except that bond wires 289 have been replaced by an electrically conductive clip 342 and bond wires 290 have been replaced by an electrically conductive clip 344. Thus, semiconductor component 340 includes a III-N cascode switch in which the substrate of the III-N semiconductor material is electrically floating and bond pads are formed over active regions of semiconductor device 40B.

Semiconductor component 340 may be represented schematically by circuit schematic 176 of FIG. 15. Thus, the substrate material of III-N semiconductor device 40 of semiconductor component 340 is floating, e.g., terminal 8B of III-N transistor 8 is open or floating. It should be appreciated that semiconductor component 320 may be configured for packaging in a package that conforms with through hole package outlines such as, for example, a TO-220 package, a TO-247 package, a TO-264 package, a TO-257 package, or the like.

Figure 34:
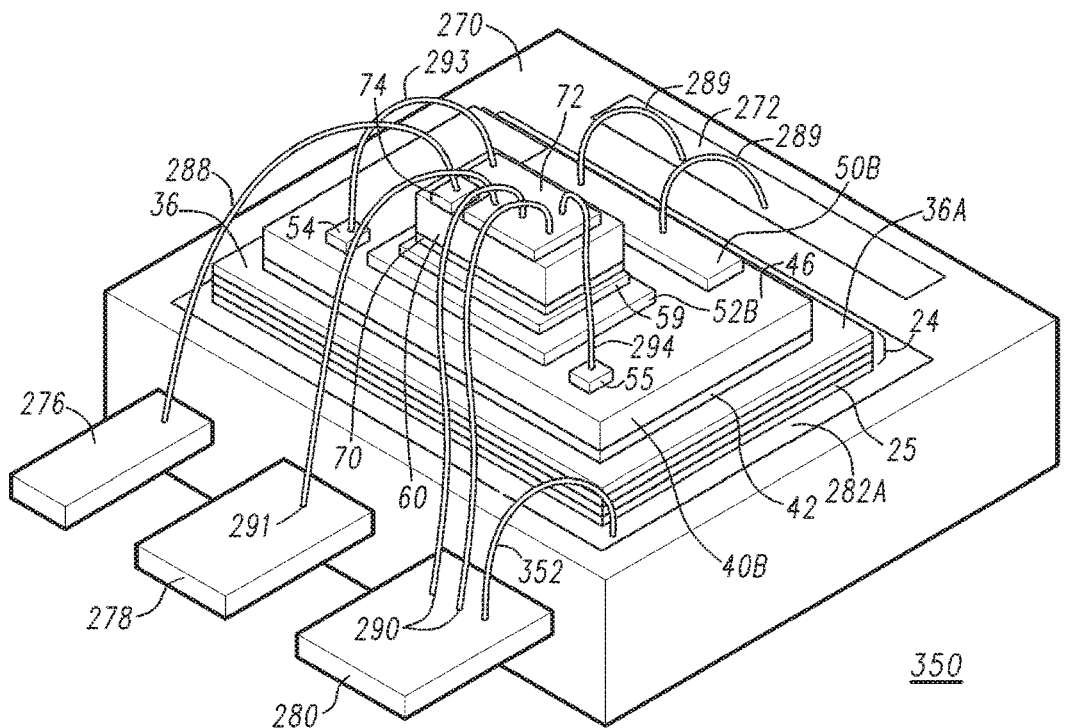
FIG. 34 is a perspective view of a semiconductor component in a cascode configuration in accordance with another embodiment of the present invention.

FIG. 34 is a perspective view of a semiconductor component 350 in accordance with another embodiment of the present invention. Semiconductor component 350 is similar to semiconductor component 340 except that semiconductor component 350 includes a bond wire bond wire 352 connecting surface 282A of pad 282 to leadframe lead 280. Bond wire 352 electrically connects pad 282 to leadframe lead 280 and thus to source contact 72 of semiconductor device 60. Thus, semiconductor component 350 includes a III-N cascode switch in which the substrate of the III-N semiconductor material is grounded and bond pads are formed over active regions of semiconductor device 40B.

Thus, semiconductor component 350 includes a III-N cascode switch in which the substrate of the III-N semiconductor material is source 72 of silicon transistor 60 and bond pads are formed over active regions of semiconductor device 40B.

Semiconductor component 350 may be represented schematically by circuit schematic 9 of FIG. 2. Thus, the substrate material of III-N semiconductor device 40B of semiconductor component 350 is electrically connected to the source of silicon semiconductor device 60, e.g., terminal 8B of III-N transistor 8 is electrically connected to source 7S of silicon transistor 7. In accordance with an embodiment, source 7S can be connected to a ground potential. It should be appreciated that semiconductor component 160 may be configured for packaging in a package that conforms with through hole package outlines such as, for example, a TO-220 package, a TO-247 package, a TO-264 package, a TO-257 package, or the like.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
   a leadframe having first and second opposing sides, a device receiving area, and a first lead integrally formed with the leadframe;
   an insulated metal substrate having a first surface and a second surface, the second surface coupled to the leadframe;
   a first semiconductor chip mounted to the insulated metal substrate, the first semiconductor chip having first and second surfaces, a first gate bond pad, a first source bond pad, and a first drain bond pad, the first semiconductor chip configured from a III-N semiconductor material, wherein the second surface of the first semiconductor chip is coupled to the insulated metal substrate; and
   a second semiconductor chip mounted to the first semiconductor chip and having first and second surfaces, an anode formed from the first surface and a cathode formed from the second surface, wherein the cathode is coupled to the first source bond pad.

2. The semiconductor component of claim 1, further including a second lead that is electrically isolated from the leadframe and wherein the first gate bond pad is electrically coupled to the anode and the anode is electrically coupled to the second lead.

3. The semiconductor component of claim 2, wherein the drain bond pad is electrically coupled to the leadframe by a first clip or a first set of bonding wires, and wherein the anode is electrically coupled to the leadframe by a second clip or a second set of bonding wires.

4. The semiconductor component of claim 2, wherein the insulated metal substrate is electrically connected to the second lead.

5. The semiconductor component of claim 1, wherein the first semiconductor chip includes an active area and wherein the first source bond pad and the first drain bond pad are over the active area.

6. A semiconductor component, comprising:
   a support structure having a top surface, a bottom surface, a mold compound between the top surface and the bottom surface, first, second, and third leads extending from a side, a die receiving structure in the mold compound, and an interconnect structure in the mold compound;
   an electrically insulating support having a first surface and a second surface, the second surface opposite the first surface and electrically coupled to the die receiving structure;
   a first semiconductor chip mounted to the second surface of the electrically insulating support, the first semiconductor chip having first and second surfaces, a first gate bond pad, a first source bond pad, and a first drain bond pad, the first semiconductor chip configured from a III-N semiconductor material, wherein the second surface of the first semiconductor chip is coupled to the electrically insulating substrate; and
   a second semiconductor chip mounted to the first semiconductor chip and having first and second surfaces, a second gate bond pad, a second source bond pad, and a second drain bond pad, the second semiconductor chip configured from a silicon based material, wherein the second surface of the second semiconductor chip is coupled to the first source bond pad.

7. The semiconductor component of claim 6, wherein the first drain bond pad is electrically coupled to the interconnect structure, the second source bond pad is electrically coupled to the second lead and to the third lead, and the second gate bond pad electrically coupled to the first lead.

8. The semiconductor component of claim 7, wherein the die receiving area is electrically coupled to the third lead.

9. The semiconductor component of claim 7, wherein the first drain bond pad is electrically coupled to the interconnect structure by a first clip or a first set of bonding wires, and wherein the second source bond pad is electrically coupled to the second lead and to the third lead by a second clip or a second set of bonding wires.

10. The semiconductor component of claim 6, wherein the first gate bond pad is electrically coupled to the second source bond pad.

11. The semiconductor component of claim 6, wherein the first semiconductor chip further comprises a third gate bond pad, the third gate bond pad electrically coupled to the second source bond pad of the second semiconductor chip.

12. The semiconductor component of claim 6, wherein the first semiconductor chip includes an active area and wherein the source bond pad and the drain bond pad are over the active area.

13. A semiconductor component having at least a first terminal, comprising:
   a leadframe having first and second opposing sides and a first lead, the first lead integrally formed with the leadframe and a portion of the first side serving as a die receiving area and a second lead, wherein the second lead is electrically isolated from the leadframe;
   an electrically insulating support having a first surface and a second surface, the second surface opposite the first surface and electrically coupled to the die receiving area;
   a first semiconductor chip mounted to the die receiving area, the first semiconductor chip comprising a first substrate having a first surface and a second surface that serve as first and second surfaces of the first semiconductor chip, respectively, a first gate bond pad, a first source bond pad, and a first drain bond pad, the first semiconductor chip configured from a III-N semiconductor material, wherein the second surface of the first semiconductor chip is coupled to the first surface of the electrically insulating support; and
   a second semiconductor chip mounted to the first semiconductor chip and having first and second surfaces, the second semiconductor chip configured from a silicon based material, wherein the second surface of the second semiconductor chip is coupled to the first source bond pad.

14. The semiconductor component of claim 13, wherein the second semiconductor chip comprises a diode having an anode and a cathode, the anode formed from the first surface and the cathode formed from the second surface.

15. The semiconductor component of claim 14, wherein the cathode is electrically bonded to the first source bond pad.

16. The semiconductor component of claim 14, wherein the first drain bond pad is electrically coupled to the leadframe using a clip or one or more bonding wires.

17. The semiconductor component of claim 13, wherein the second semiconductor chip comprises a transistor comprising a first substrate having a first surface and a second surface that serve as first and second surfaces of the second semiconductor chip, respectively, a second gate bond pad, a second source bond pad, and a second drain bond pad, wherein the second source bond pad is electrically coupled to the second lead and to the second gate bond pad.

18. The semiconductor component of claim 17, wherein the first drain bond pad is electrically coupled to the leadframe, the second source bond pad is electrically coupled to the first gate bond pad and the second source bond pad is electrically coupled to the second lead.

19. The semiconductor component of claim 13, further including an electrical interconnect that couples the die receiving area to the third lead.

20. The semiconductor component of claim 13, wherein the first semiconductor chip includes an active area and wherein the source bond pad and the drain bond pad are over the active area.

\* \* \* \* \*